United States Patent [19]

Sauer

[11] Patent Number: 5,262,779
[45] Date of Patent: Nov. 16, 1993

[54] ANALOG TO DIGITAL CONVERTER

[75] Inventor: Donald J. Sauer, Monmouth, N.J.

[73] Assignee: David Sarnoff Research Center, Inc., Princeton, N.J.

[21] Appl. No.: 724,637

[22] Filed: Jul. 2, 1991

[30] Foreign Application Priority Data

Jul. 2, 1990 [GB] United Kingdom ............. 9014679

[51] Int. Cl.⁵ ............ H03M 1/10; H03M 1/38; H03K 3/356; H03K 3/023
[52] U.S. Cl. ................ 341/161; 341/118; 341/120; 307/491; 307/494; 307/362
[58] Field of Search ............ 341/161, 118, 120, 158, 341/155; 307/362, 491, 494

[56] References Cited

U.S. PATENT DOCUMENTS

| | | | |
|---|---|---|---|
| 4,228,423 | 10/1980 | Schwerdt. | |
| 4,262,221 | 4/1981 | Dingwall | 307/355 |
| 4,385,286 | 5/1983 | Haque | 341/108 |
| 4,553,128 | 11/1985 | Pilost. | |
| 4,620,179 | 10/1986 | Cooper et al. | |
| 4,691,189 | 9/1987 | Dingwall | 340/347 |
| 4,940,981 | 7/1990 | Naylor et al. | 341/161 |
| 4,989,003 | 1/1991 | Sauer | 341/136 |
| 4,999,633 | 3/1991 | Draxelmayr | 341/161 X |
| 5,028,926 | 7/1991 | Tokuhiro | 341/161 |
| 5,032,744 | 7/1991 | Wai Yeung Liu | 307/491 |

FOREIGN PATENT DOCUMENTS 0111230 6/1984 European Pat. Off. .

Primary Examiner—Sharon D. Logan
Attorney, Agent, or Firm—William J. Burke

[57] ABSTRACT

There is disclosed an ADC including a comparator which sets, bit-by-bit, a successive approximation binary register. Feedback means for auto-biasing, auto calibration, and offset compensation within the ADC are provided. The ADC sets itself to a high degree of accuracy automatically by reference to a master voltage reference. A number of identical ADCs are connected in parallel to provide an increased sampling rate. The ADC architecture compensates for component tolerance differences, for common mode noise, and for secondary parasitic effects. The ADC operates with high resolution at high speed (e.g., 10 bits at 50 MHz), and can be implemented in MOS technology with good integrated circuit chip yield and is compatible with new ASICs.

51 Claims, 7 Drawing Sheets

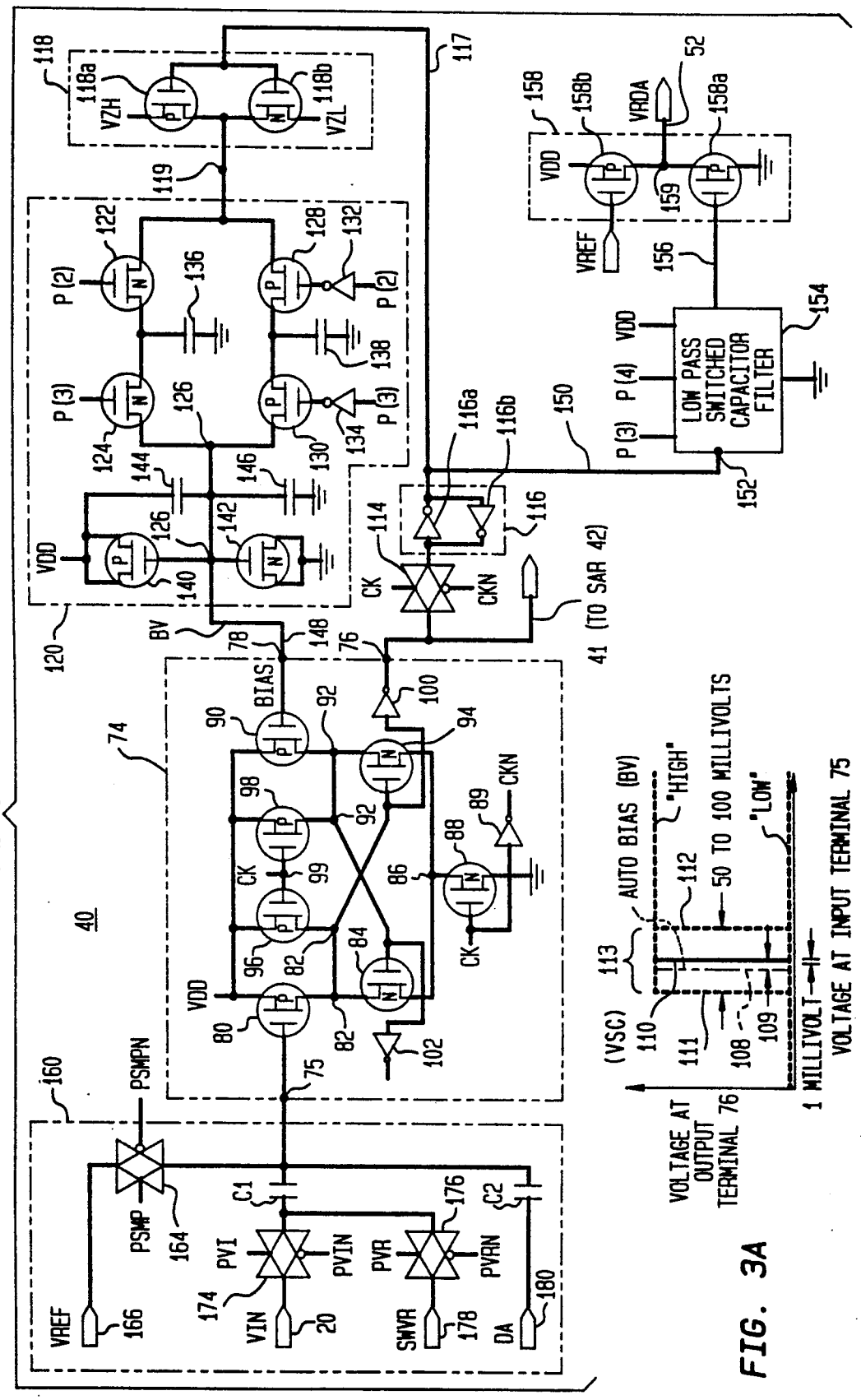

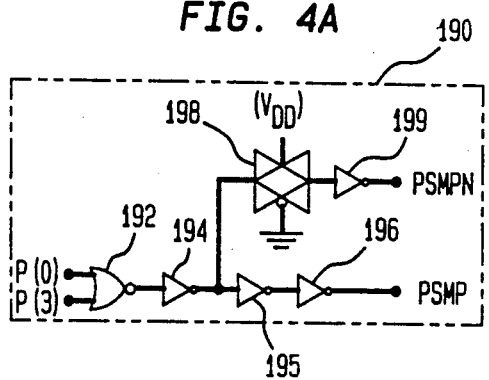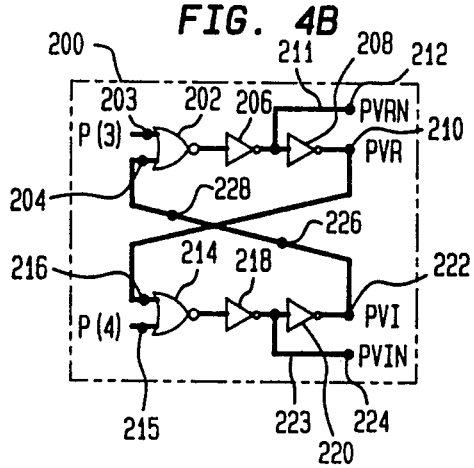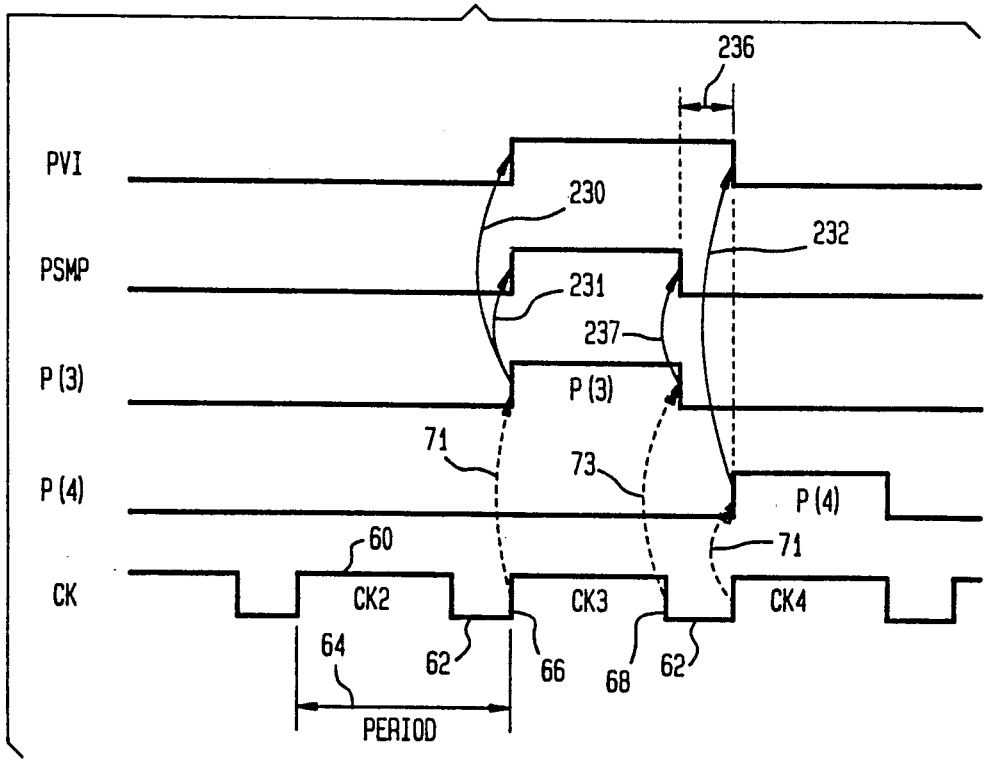

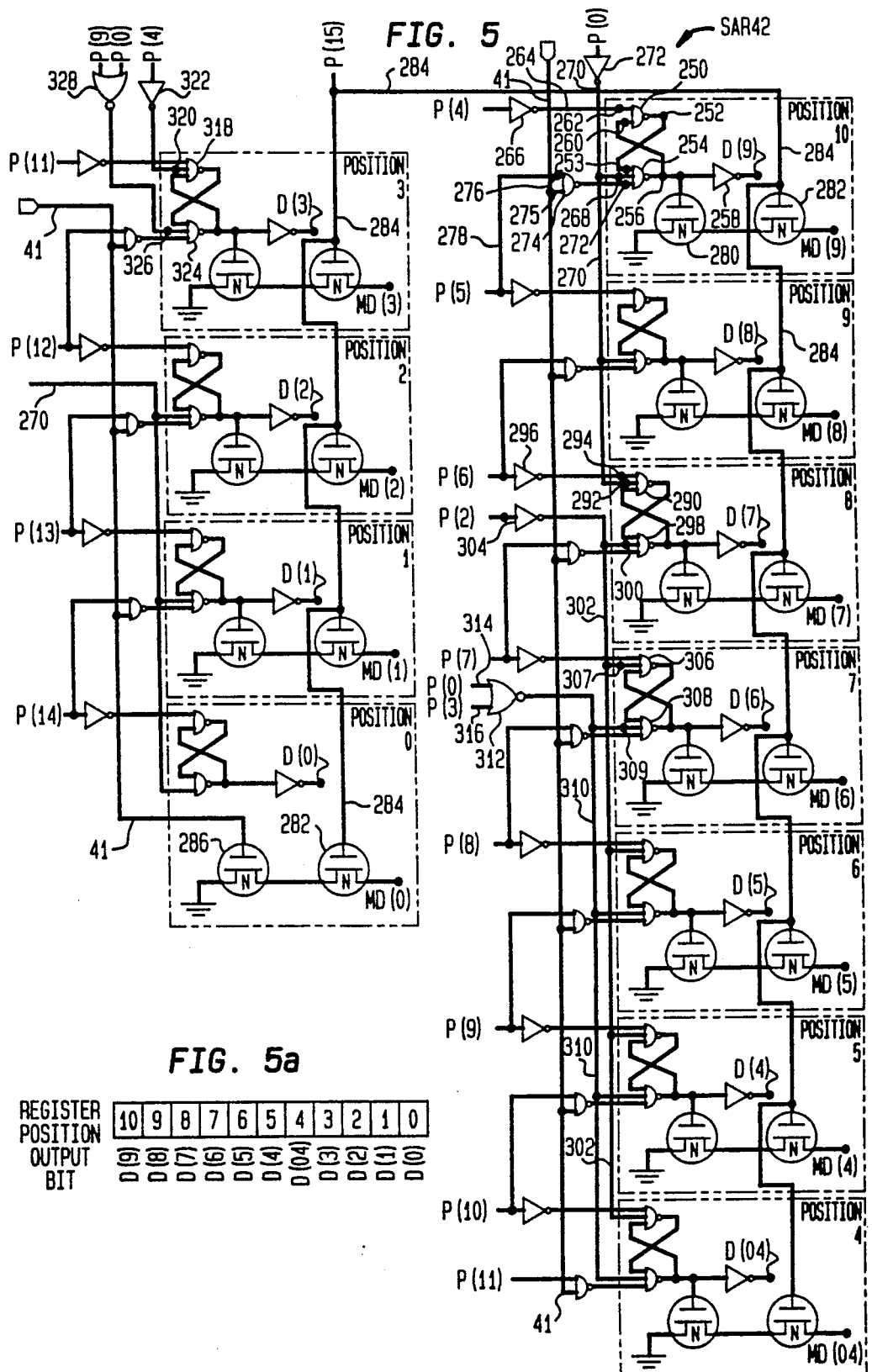

FIG. 7

SAR POSITIONS (CORRESPONDING TO FIG'S 5 AND 5A)

| PHASES | 10 | 9 | 8 | 7 | 6 | 5 | 4 | 3 | 2 | 1 | 0 |
|---|---|---|---|---|---|---|---|---|---|---|---|
| P(0)  | 0   | 0   | 1   | 0   | 0   | 0   | 0   | 0 | 0 | 0 | 0 |
| P(1)  | 0   | 0   | 1   | 0   | 0   | 0   | 0   | 0 | 0 | 0 | 0 |
| P(2)  | 0   | 0   | 0   | 1   | 1   | 1   | 1   | 0 | 0 | 0 | 0 |
| P(3)  | 0   | 0   | 0   | 0   | 0   | 0   | 0   | 0 | 0 | 0 | 0 |
| P(4)  | 1/S | 0   | 0   | 0   | 0   | 0   | 0   | 1 | 0 | 0 | 0 |
| P(5)  | S   | 1/S | 0   | 0   | 0   | 0   | 0   | 1 | 0 | 0 | 0 |
| P(6)  | S   | S   | 1/S | 0   | 0   | 0   | 0   | 1 | 0 | 0 | 0 |
| P(7)  | S   | S   | S   | 1/S | 0   | 0   | 0   | 1 | 0 | 0 | 0 |
| P(8)  | S   | S   | S   | S   | 1/S | 0   | 0   | 1 | 0 | 0 | 0 |
| P(9)  | S   | S   | S   | S   | S   | 1/S | 0   | 0 | 0 | 0 | 0 |
| P(10) | S   | S   | S   | S   | S   | S   | 1/S | 0 | 0 | 0 | 0 |
| P(11) | S   | S   | S   | S   | S   | S   | S   | 1/S | 0 | 0 | 0 |
| P(12) | S   | S   | S   | S   | S   | S   | S   | S | 1/S | 0 | 0 |
| P(13) | S   | S   | S   | S   | S   | S   | S   | S | S | 1/S | 0 |
| P(14) | S   | S   | S   | S   | S   | S   | S   | S | S | S | 1/S |
| P(15) | S   | S   | S   | S   | S   | S   | S   | S | S | S | S |

ANALOG TO DIGITAL CONVERTER

FIELD OF THE INVENTION

The invention relates to an analog to digital converter (ADC) which operates at high speed and provides high resolution, and more particularly, to an ADC which can be made using metal oxide semiconductor (MOS) technology to obtain very high performance with low power requirements and low cost.

BACKGROUND OF THE INVENTION

In digital signal processing it is necessary to convert an analog signal into a digital format. To insure reasonable fidelity in this conversion, it is desirable to sample the analog signal at a rate substantially greater than analog signal bandwidth. These sampled signal values are then converted sample by sample at high speed into their equivalent digital values represented by "N" number of binary bits. Prior art ADCs, which typically use bipolar transistors, are able to operate at high rates (e.g., 50 MHz) and with 10-bit resolution. These ADCs require relatively large amounts of power (watts) and are very costly (hundreds of dollars). On the other hand, attempts to implement high speed, multi-bit ADCs with MOS technology have not been as successful as desired. Either cost was high because of poor chip yield or performance was substantially less than could be obtained using bipolar transistor technology.

One of the problems in implementing a high speed ADC in MOS technology is that of "noise" caused by induced currents in the silicon substrate of a MOS chip. To some extent this problem can be minimized by careful shielding, by the separation and isolation of power supply busses, and by the use of complementary metal oxide semiconductor (CMOS) transistors, that is, n-channel and p-channel MOS transistors (NMOS and PMOS). However, the presence of residual noise, switching transients, stray capacity, etc., impose certain design constraints and other limitations on the sensitivity and sampling speed of an ADC using MOS technology as discussed in my U.S. Pat. No. 4,989,003.

Another problem is that the individual transistors and capacitors in a MOS circuit may have values of threshold voltage, capacitance, etc., which can vary by as much as 10%. These variations make it extremely difficult to build a high speed, precision ADC requiring closely matched components, or which have large switching transients.

A prior ADC, termed an "N-flash" ADC, simultaneously produces "N" data bits in parallel from a sampled analog voltage. The ADC comprises $2^N$ comparators which are closely matched to each other with each capable of high resolution. The ADC circuit momentarily connects all of these comparators at once to an input signal circuit. The individual comparators then simultaneously determine the values of the N bits corresponding to the analog value of the input signal being sampled at that instant. An advantage of this ADC is the high speed at which it can operate. An important disadvantage is the heavy capacitive load (and corresponding large switching transients) caused by connecting all of the comparators to the input circuit at the same time. As an example, for a 10 bit output (where N equals 10) ADC the number of comparators is 1024! Thus the applied load represented by all the comparators connected in parallel is hundreds of times greater than that of a single comparator alone, giving rise to undesirably large switching transients. An important reason for lowering these switching transients is that the recovery time from these transients sets the upper limit on the sampling rate of the ADC. This undesirable condition is aggravated in MOS technology where the input impedance levels are inherently high and switching transients are more pronounced than with bipolar technology because of the need for switched capacitor autozero input circuitry to correct the relatively large MOS threshold voltage offsets.

Another ADC, called a serial ADC, samples an analog signal and then bit-by-bit determines the digital value of the sample. A single comparator in the ADC can be used to determine all of the bit values and hence switching transients are greatly reduced compared to an "N-flash" ADC. However, the speed of a serial ADC is relatively slow because of the time taken in the sequential determination of the bit values of the digital output. Thus for a 10-bit output ADC, a serial ADC may run at only one-tenth the speed of a 10-bit "N-flash" ADC. It will thus be appreciated that the requirement for high speed in an ADC conflicts in important ways with the requirement for high resolution; and that the desire for low cost, through the use of MOS technology, conflicts with the desire for high performance.

It is desirable to have a high speed and relatively low cost ADC formed on a semiconductor substrate using MOS technology which may be integrated with digital MOS circuitry on the same semiconductor substrate.

SUMMARY OF THE INVENTION

The invention provides a highly effective and efficient new architecture for an ADC. This ADC is readily implemented in present day MOS technology (e.g., standard one-micron N-well manufacturing technology) either as a stand-alone unit or as a sub-module of a larger application-specific integrated circuit (ASIC). Thus the new ADC can be manufactured at very low cost compared to previous ADCs and is fully compatible with the newer ASIC MOS digital circuits. A number of unique design features enable this new ADC to operate at high speed with high resolution (e.g., 10-bits) with good immunity to noise and with very low power requirements. The unique architecture of this new ADC also substantially improves yield of "good" chips which factor further contributes to low cost.

A high performance serial ADC is implemented through novel architecture which obviates the need for closely matched transistors and capacitors and which minimizes the delays and accuracy-destroying effects of switching transients. This architecture includes a novel high speed comparator circuit having balanced PMOS and NMOS transistors by which a high degree of common-mode noise immunity is obtained. The comparator circuit includes an active feedback loop (unique in itself) by which the comparator continually and automatically "zeroes" or biases itself to an accurately determined switching point which is continually referenced to a master voltage reference. A switching sensitivity of one millivolt (mV) at an exactly determined switching point is obtained by the auto-bias action even though the PMOS and NMOS transistors and associated coupling capacitors are not exactly matched, or age with time. Unwanted errors caused by parasitic capacitive coupling at terminals within the comparator are substantially eliminated by the action of this autobias loop.

These complimentary transistors are biased into high-gain regions and are provided with regenerative feedback for very fast switching. Since they are balanced for common mode noise rejection they are stable in a noisy digital environment as in an ASIC. Their sampling aperture is very narrow (about 200 picoseconds) further enabling the comparator circuit and the ADC to operate at a very high clock rate (e.g., 50 MHz). The comparator circuit drives a uniquely configured serial-bit register which operates by successive approximation to determine the digital value of a sampled voltage. The register has a unique arrangement of N+1 bit positions, corresponding to the N bits in a digitized signal plus an extra bit used for "switching offset compensation". The extra offset-compensation bit, by compensating for settling time (resulting from an RC time constant) in the comparator's input circuitry (also novel), enables the comparator to operate at much higher speed (e.g., twice as fast) than otherwise. This extra bit, representing an offset compensation voltage, is applied by the register in a successive approximation algorithm, described in detail hereinafter. The comparator, operating in conjunction with the bit register, successively and at very high speed determines the values one-by-one of the most significant to the least significant bits of the N bit digital value of a sampled analog signal voltage. A resolution of 10-bits (N=10) is easily obtained. The serial bit register is subdivided into a first portion representing the more-significant-bits (MSBs) of the N-bits, a second portion representing the less-significant-bits (LSBs) of the N bits, and a third portion representing the extra offset compensation bit. The MSB portion of the register drives a digital-to-analog converter (DAC) which applies, on command to the comparator, an analog reference voltage representing the MSBs then in the register. The accuracy of this analog reference voltage is determined by reference to a very accurate master voltage reference. Similarly the LSB portion and the offset bit portion of the register together drive a DAC which applies on command another analog reference voltage to the comparator representing the LSBs and offset bit then in the register. A high degree of accuracy (within a mV) of this analog reference voltage from the LSB DAC is provided by an active auto-calibrating feedback loop to and from the LSB DAC and the comparator. By this means the comparator continually and automatically calibrates the LSB DAC relative to the master voltage reference. Thus extremely high resolution (better than one part in several thousand) for the ADC, is obtained even though the circuit components may have relatively large tolerance variations and operate at very high speed in noisy environments.

Identical ones of these new ADCs are arranged in a parallel assembly of closely adjacent multiple ADCs. By way of example, for a 10-bit (N=10) ADC, sixteen clock phases, synchronized to an external clock, are employed. Five phase counts are used by the ADC for auto-zeroing, auto-calibration, signal sampling and digital output multiplexing. Eleven phase counts are used in determining the ten data bits and to accommodate the one offset bit. Sixteen ADCs are provided in the overall assembly, and the sampling phase of each ADC is skewed by one phase relative to a preceding ADC. Thus only one comparator of a ADC in the assembly is sampling the analog signal input at any one time, but all sixteen ADCs will have sampled the input during the sixteen phase count cycle. Thus the effective analog-to-digital conversion speed of the multi-ADC assembly is multiplied by sixteen though only one comparator is switched "on" for sampling at any given phase count. The overall accuracy of all the ADCs operating together is determined by the single master voltage reference through the individual auto-zeroing and auto-calibration of the converter within each ADC. The practical implementation with good chip yield in MOS technology of multiple ADCs like this is greatly facilitated by the unique architecture of each ADC.

The invention is also an ADC having N bit resolution in which an N+1 bit successive approximation register (SAR) has an input terminal and N+1 output terminals with N bit resolution, first and second DACs, and a comparator. The first DAC has an output terminal and has an input terminal coupled to a first subset (M) of the N+1 output terminals of the N+1 bit SAR, where M is less than N. The second DAC has a calibration input terminal and an output terminal and has N-M+1 input terminals which are coupled to N-M+1 output terminals of the N+1 bit SAR. The comparator has a first input terminal adapted to receive an analog signal, a second input terminal coupled to the output of the first DAC, a third input terminal coupled to the output terminal of the second DAC, a first output terminal coupled to an input terminal of the N+1 bit SAR, and a second output terminal coupled to the calibration input terminal of the second DAC.

The invention is also an ADC having N bit resolution in which an N+1 bit SAR has an input terminal and N+1 output terminals with N bit resolution, first and second DACs, and a comparator. The first DAC has an output terminal and has an input terminal coupled to a first sub-set (M) of the N+1 output terminals of the N+1 bit SAR, where M is less than N. The second DAC has a calibration input terminal and an output terminal and has N-M+1 input terminals which are coupled to N-M+1 output terminals of the N+1 bit SAR. The comparator has a first input terminal adapted to receive an analog signal, a second input terminal coupled to the output of the first DAC, a third input terminal coupled to the output terminal of the second DAC, a first output terminal coupled to an input terminal of the N+1 bit SAR, and a second output terminal coupled to the calibration input terminal of the second DAC. The comparator is an auto-zero comparator comprising: means for generating a data input reference voltage level and first data input signals which have voltage levels greater than the input reference voltage level and second data signals which have voltage levels less than the input reference voltage level; a clocked latch circuit having a data input terminal, a reference voltage input terminal, and an output terminal, the clocked latch circuit being adapted to generate output logic states when clocked on, and further being adapted to maintain the output logic state achieved from the first or second data signals applied to the data input terminal thereof when same is clocked on even if the data signal changes; and feedback and voltage reference means, which has an input coupled to the output of the clocked latch circuit and has an output coupled to the reference input terminal of the clocked latch circuit, for setting a voltage level at the output terminal thereof when the clocked latch circuit is clocked on and the data input reference voltage of the generating means is coupled to the data input terminal to a voltage level which is essentially equal to the level of the data input reference voltage such that, when input data signals are coupled to the data input terminal of the clocked latch circuit and it is clocked on, the clocked latch circuit switches output states when the data input signal is above or below the data reference voltage level.

The invention is also an ADC having N bit resolution in which an N+1 bit SAR has an input terminal and N+1 output terminals with N bit resolution, an N+1 bit DAC, and a comparator. The N+1 bit DAC has an output terminal and has input terminals coupled to the N+1 output terminals of the N+1 bit SAR. The comparator has a first input terminal adapted to receive an analog signal, a second input terminal coupled to the output of the N+1 bit DAC, and a first output terminal coupled to an input terminal of the N+1 bit SAR.

The invention is also an ADC having N bit resolution in which a SAR has an input terminal and output terminals with N bit resolution, a DAC, a comparator, and offset compensation means. The DAC has an output terminal and has input terminals coupled to the output terminals of the SAR. The comparator has a first input terminal adapted to receive an analog signal, a second input terminal coupled to the output of the DAC, and a first output terminal coupled to an input terminal of the SAR. The offset compensation means generates an offset compensating signal which is coupled to the comparator so as to compensate for settling time errors.

The invention is also an ADC having N bit resolution having a comparator means, timing means, and offset compensating means. The comparator means has an input for sampling an input analog voltage during successive cycles of operation and for generating a succession of bit outputs each of which is either a binary 0 or 1 depending on whether the input analog voltage is below or above a given voltage, the voltage at the input being subject to settling time. The timing means drives the comparator means with clock pulses having a duration. The offset compensating means applies to the comparator input in a successively decreasing amount an offset voltage such that errors are limited in the high speed sampling of the input analog voltage by the comparator means, and such that the clock duration is made substantially shorter than the settling time, whereby the ADC operates accurately at a speed substantially higher than the settling time would otherwise permit.

The invention is also an ADC having N bit resolution having a comparator means, first and second referencing means, SAR means, timing means, DAC means, and feedback means. The comparator means has input means for receiving an analog input voltage and has an output to which it applies a binary bit output the value of which depends on whether the analog input voltage is above or below a set voltage. The first referencing means references the set voltage to a master voltage reference. The SAR means receives the output of the comparator means and accumulates and stores partial sums of bits in a binary word of N bits. The timing means drives the comparator means and the register means through a complete cycle of operation during which the N-bits are accumulated in the register means. The DAC means is driven by the register means and provides in accordance with a weighted partial sum of bits from the register means an output analog voltage. The second referencing means references the output analog voltage of the DAC means to a master voltage reference. The feedback means applies the output analog voltage of the DAC means to the input means of the comparator means.

The invention is also a high speed comparator for an ADC having a latch means, a clock means, an input means, an auto bias means and a voltage reference feedback means. The latch means has a signal input, a bias input, and an output. It rapidly switches its output either high or low in voltage depending on whether the voltage on the signal input is higher or lower than a bias voltage on the bias input. The clock means resets the latch means for each switching operation. The input means selectively applies a voltage to be sampled or a reference voltage to the signal input of the latch means. The auto bias means sets at a desired value the bias voltage to achieve high sensitivity and high switching speed. The auto bias means is connected between the latch output and the bias input. The voltage reference feedback means comprises the latch means, the input means and the auto bias means for referencing the bias voltage to an accurately determined value such that the latch means switches high or low at a voltage very closely corresponding to the reference voltage.

BRIEF DESCRIPTION OF THE DRAWINGS

FIG. 3 is a schematic diagram of a comparator circuit (part of each one of the ADCs of FIG. 1) according to another aspect of the invention;

FIG. 3A is a voltage diagram showing the important effect of auto-bias for the comparator of FIG. 3;

FIG. 4A shows a circuit for obtaining the timing signals "PSMP" and "PSMPN" as used in the comparator of FIG. 3;

FIG. 4B shows a circuit for obtaining the timing signals "PVR", "PVRN" and the signals "PVI" and "PVIN" as used in the comparator;

FIG. 4C shows a timing relationship of "PVI" to "PSMP" and phases P(3) and P(4).

FIG. 5 is a circuit diagram of a SAR of an ADC as shown in FIG. 1;

FIG. 5A is a schematic representation of the bit positions of the SAR in FIG. 5;

FIG. 7 is a chart showing the sequence of operation of one of the ADCs of FIG. 1.

DETAILED DESCRIPTION

Figure 1:
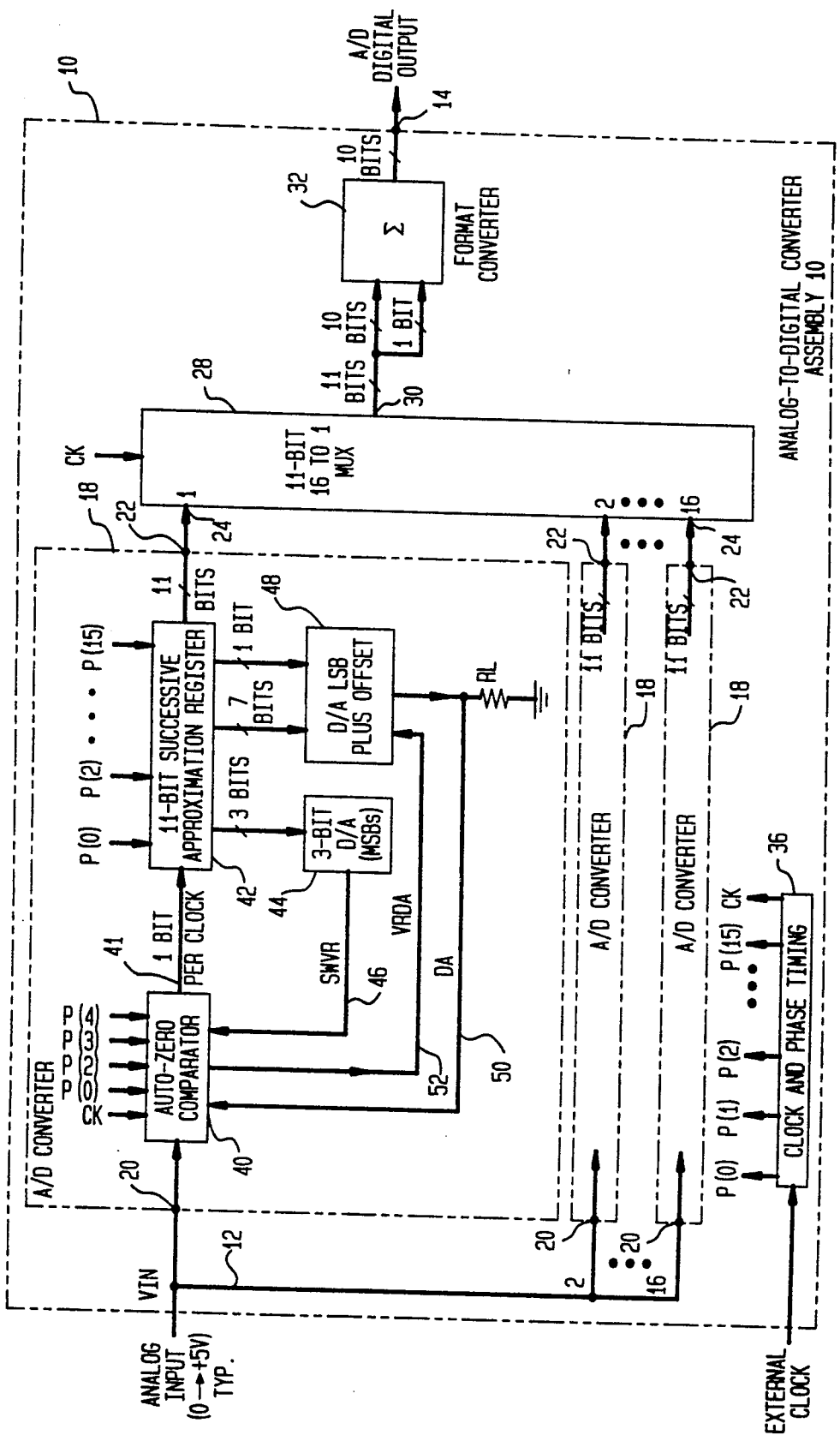
FIG. 1 is a schematic diagram of an ADC of the invention including an assembly of multiple ones of identical ADCs arranged in parallel and being driven by skewed clock and phase pulses.

In FIG. 1, an ADC assembly 10 (shown within a large dashed line rectangle) comprises an analog signal input which is connected to a buss 12 and a digital output signal terminal 14. A high frequency signal may be applied to input buss 12, and its digital equivalent, shown here as a 10-bit number, obtained in real time at output terminal 14. Assembly 10 is shown comprising sixteen ADCs 18 (each being shown within a dashed line box). The first, second, third and sixteenth ADCs 18 are shown with only the first being shown in detail. Typically assembly 10 is formed on a silicon substrate using MOS technology with each ADC 18 being implemented in about 300 square mils of area. For example, there may be sixteen ADCs 18 in an assembly 10 and each ADC 18 is shown here (and subsequently) as generating an 11-bit number (N+1). Each ADC 18 has a respective voltage input terminal 20, which input terminals are connected in parallel to the input buss 12 and to which are applied an analog signal input voltage (VIN) which is to be digitized. Each ADC 18 has an output signal terminal 22 which is connected to a respective one of input terminals 24 of a multiplex (MUX) unit 28 (shown as "11-Bit 16:1 MUX") of a type well known in the art. The MUX unit 28 has a single output terminal 30 to which it applies in sequence the parallel 11-bit "words", or digitized signals, generated by the individual ADCs 18. Connected to output 30 of the MUX 28 is an adder and format converter 32, also known in the art. Each 11-bit "word" from the MUX 28 is in non-standard binary format (N+1). Format converter 32 converts each such word into a standard 10-bit (N) format and then applies these digital values as 10 bit words in real time to the output terminal 14 of the assembly 10.

Each ADC 18 is driven by a clock and phase timing unit 36 which as shown here, generates sixteen phases P(0) to P(15) and a clock pulse "CK". Each phase P is skewed by one clock pulse and there are thus sixteen phases for each complete cycle of the timing unit 36. Each of the ADCs 18 is driven by all of the phases P and the clock pulses CK of unit 36 but the drive of the second ADC 18 is skewed by one phase P relative to the drive of the first ADC 18, and so on, with each ADC 18 skewed in its operation by one phase relative to the prior ADC 18. Thus the sixteen ADCs 18 respectively sample the input voltage VIN at sixteen successive instants, and so on. This arrangement effectively increases the composite sampling speed of ADC assembly 10 by sixteen. It is to be understood that fewer (or more) ADCs 18 may be used depending on the sampling speed desired, and the signal processing time within each ADC 18.

Each ADC 18 comprises an auto-zero comparator 40 which via a lead 41 sends single-bit data to a SAR 42 (shown as an "11-bit SAR"). Comparator 40 momentarily samples the input voltage VIN at the input terminal 20, and thereafter, in a clocked sequence in combination with the SAR 42, determines bit-by-bit the digital value of the sampled input voltage. SAR 42 provides three more-significant-bits (MSB) of data to a DAC (shown as "3 bit MSBs DAC") 44 which in turn applies an analog "switched voltage reference" (SWVR) in a feedback loop 46 to the comparator 40. In a similar way, SAR 42 applies seven less-significant-bits (LSBs) plus one "offset compensation" bit to a DAC (shown as "LSB DAC plus offset") 48. This LSB DAC 48, which is of a type well known in the art, supplies to a load resistor RL a constant current whose analog value corresponds very accurately to the digital value of the 7 LSBs plus the one offset bit. The voltage drop across resistor RL, which may for example be 1000 ohms, is thus an analog voltage "DA" which is applied via a lead 50 to an input of the comparator 40. The comparator 40, in turn, via a feedback lead 52, from an auto-calibrating feedback arrangement to be described shortly, applies an automatically calibrated analog voltage reference "VRDA" to the LSB DAC 48. This reference voltage VRDA automatically controls the LSB DAC 48 so that its output current (and the voltage across resistor RL) is accurately referenced to a master voltage reference (not shown). Each ADC 18 is connected to the master voltage reference as will be described shortly. The reference voltages SWVR, DA and VRDA, though separate, are automatically and continually referenced individually (e.g., each within a mV) against the master voltage reference (not shown) through a sequence of steps which are described below. Thus each ADC 18 is automatically made very accurate within its own cycle of operation, and the multiple operations of all of the ADCs 18 in assembly 10 are tied together with equal, automatically obtained accuracy from the single master voltage reference the clock pulses (CK) and the phases P(0) to P(15) produced by the timing unit 36 (see FIG. 1) during a cycle of operation of each ADC 18 of FIG. 1. Each clock pulse CK is in the form of an asymmetrical square wave having a "high" state 60, a "low" state 62, and a duration (period) 64. This duration 64 may, for example, be 20 nanoseconds. A clock pulse CK goes from low to high (in voltage) at a rising leading edge 66 occurring at the beginning of a clock period 64, and from high to low at a falling trailing edge 68. The zero ("0") to the fifteenth ("15") clock pulse CK (sixteen identical pulses) are as indicated; thereafter a cycle of sixteen is repeated. The clock pulses CK in turn generate the respective phases P(0) to P(15). Thus the leading edge 66 of the "0" clock pulse CK generates (slightly displaced in time) a rising leading edge 70 going from low to high of the "0" phase P(0), as indicated by a dashed arrowed line 71, and the trailing edge 68 of the "0" clock pulse CK generates a falling trailing edge 72 (going from high to low) of phase P(0), as indicated by a dashed arrowed line 73. There is only one phase P(0) for the sixteen clock pulses CK in a cycle. Thereafter, another "0" phase P(0) is generated and the cycle begins again. In the same way a "1" phase P(1) is generated by the "1" clock pulse CK, as indicated by a dashed arrowed line 71a and a dashed arrowed line 73a, and so on, through phase P(15) as shown. These phases and clock pulses drive each ADC 18 is described hereinafter. By virtue of the offset compensation bit, mentioned earlier, the overall clock period 64 can be substantially reduced (e.g., by about half) without sacrificing accuracy.

In FIG. 3 a preferred embodiment of the auto zero comparator 40 of FIG. 1 comprises a balanced regenerative latch 74 (shown within a dashed line box), which has a signal voltage input at an input terminal 75 and a single-digit voltage output at a terminal 76. Lead 41 (see also FIG. 1) is attached to this terminal 76. An analog auto-bias voltage (BV) is applied to the latch 74 at a terminal 78. Voltage BV automatically "zeroes" the switching point of the latch to a precisely controlled value. Latch 74 comprises p-channel transistors 80, 90, 96 and 98, n-channel transistors 84, 88 and 94, and inverters 100 and 102. The sources of transistors 80, 90, 96 and 98 are coupled to a positive voltage source +VDD, and the source of transistor 88 is coupled to a reference voltage which is shown as ground. The drains of transistors 80, 84 and 96 are coupled to the gate of transistor 94, to an input of inverter 100 and to a terminal 82. The sources of transistors 90, 94 and 98 are coupled to the gate of transistor 84, to an input of inverter 102 and to a terminal 92. The drains of transistors 84 and 94 are coupled to the source of transistor 88 and to a terminal 86. The CK signal of FIG. 1 is coupled via a buss (not shown) to the gate of transistor 88, to input of inverter 89, and to the gates of transistors 96 and 98 and to a terminal 99. Inverter 89 generates at an output thereof an inverted CK signal which is shown as CKN. An output of inverter 100 is coupled to the output terminal 76 of latch 74. The purpose of inverter 102 is to provide a balanced capacity, mirror image of the inverter 100. It will be noted at this point that the circuit elements of the latch 74 are symmetrical and complementary, and are arranged to give a high degree of immunity to common mode noise. By automatically adjusting ("zeroing") the bias voltage BV on the gate of transistor 90 during operation of the comparator 40 through continual reference to the master voltage reference, the value of voltage at input terminal 75 which causes the regenerative latch 74 to switch its output voltage at terminal 76 to either "low" or "high", is very accurately determined. This is automatically done by means of a feedback loop to be described shortly.

Figure 2:
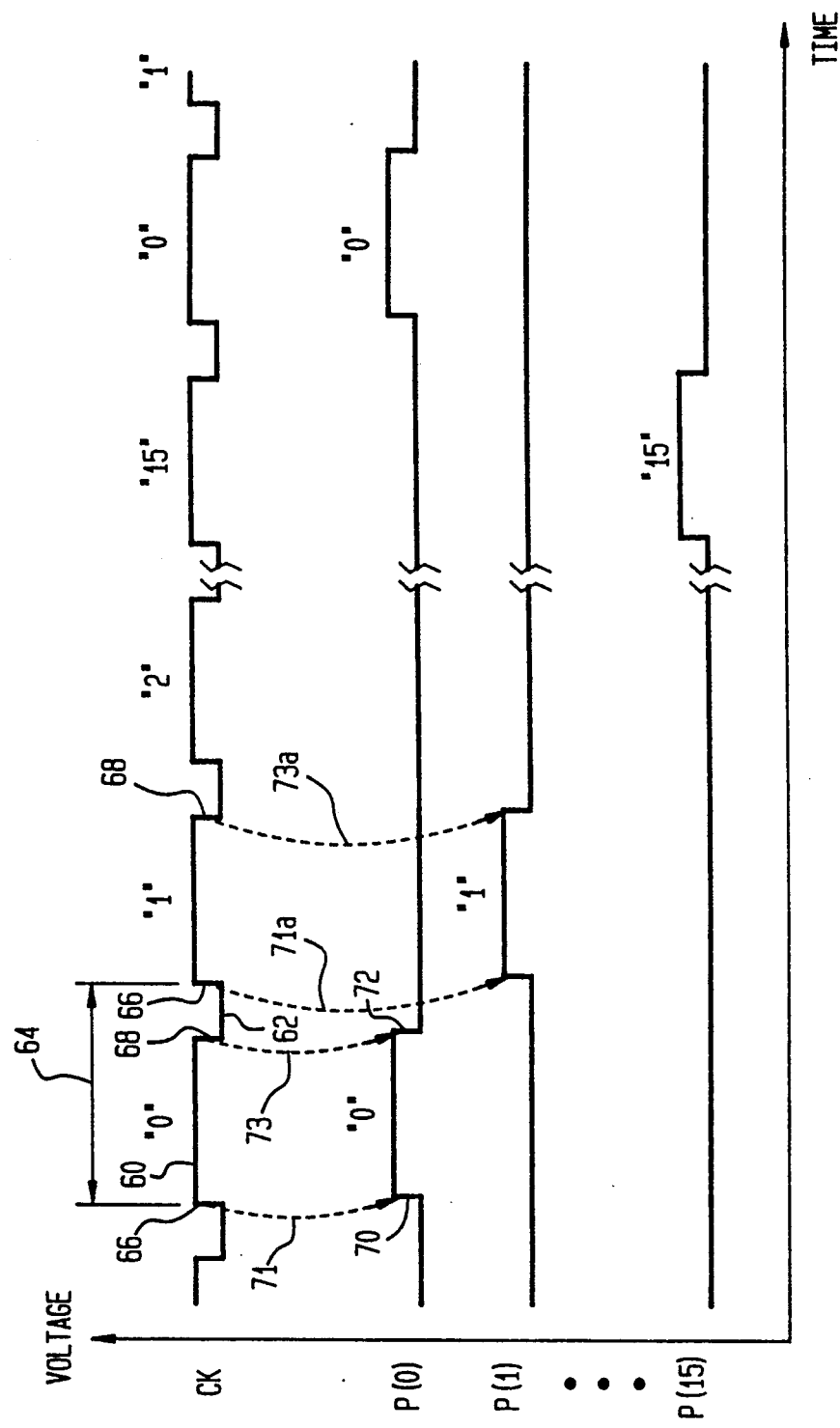
FIG. 2 is a clock and phase timing diagram of the respective phases and clock pulses used with the ADCs in FIG. 1.

When the transistor 88 of the latch 74 is turned off, and transistors 96 and 98 are turned on with each clock pulse CK, terminals 82 and 92 are pulled up in potential to the supply voltage VDD. This occurs when a clock pulse CK (see FIG. 2) goes from a high level 60 to a low level 62 along a falling trailing edge 68. Quickly thereafter at the rising leading edge 66 of the next clock pulse CK, transistor 88 turns on and transistors 96 and 98 turn off. At this instant, if the input voltage at the terminal 75 is even slightly above the bias voltage BV at terminal 78, the latch 74 switches the voltage at output terminal 76 to "high" (a value substantially equal to VDD). This is defined to be a binary "1" output of latch 74. Because of the regenerative feedback provided by the cross-coupled terminals 82 and 92, switching takes place at very high speed (e.g., in a few nanoseconds). Similarly, if the input voltage at terminal 75 is less than the bias voltage BV, the latch 74 switches the voltage on output terminal 76 to "low" (ground). This is defined to be a binary "0".

In a preferred embodiment of latch 74, inverter 100 is selected to have a threshold voltage of slightly less than VDD/2. This limits voltage spikes in output terminal 76 when the output voltage at terminal 76 is to be a "0" by not switching from a "0" to a "1" just after terminals 82 and 92 both drop to about VDD/2 after CK goes to a high. Even if terminal 82 is going to stay at a high level because input terminal 75 is more negative than bias terminal 78, it may momentarily drop to Vdd/2. By setting the threshold voltage of inverter 100 to slightly below VDD/2, a voltage spike towards a "1" at terminal 76 is prevented when the state thereof is going to remain at a "0".

In FIG. 3A, there is shown a voltage diagram relating the input voltage (horizontal axis) at the input terminal 75 of the latch 74 to the switched output voltage (vertical axis) at terminal 76. The auto bias voltage BV (shown as a dashed-dotted vertical line 108) is established by an auto-bias feedback loop to be described shortly. A solid vertical line 110 shows the voltage (VSC) at which the latch 74 switches. The voltage VSC is established as substantially equal to a reference voltage by adjusting the value of the bias voltage BV. An "offset" differential voltage, indicated by 109, between bias voltage BV at line 108, and the switching voltage VSC at line 110 compensates for small differences in the characteristics of transistors in a given latch 74 and is automatically determined by the action of the auto bias feedback loop. This offset voltage may be different from one latch 74 to another, but the switching voltage VSC is the same from latch to latch. For an input voltage at terminal 75 slightly below the switching voltage VSC, the latch 74 switches the output "low", and for a value above the switching voltage VSC, the latch switches "high". The sensitivity of switching is within 1 mV as shown. In the absence of a precisely determined or "set" value of auto-bias voltage BV along line 108, because of slight variations in the threshold voltages of the transistors in the regenerative latch 74, the latch may have a lower switching voltage indicated by a vertical dashed line 111, or a higher switching voltage indicated by a vertical dashed line 112. This variation may be as much as 50 to 100 mV from one latch 74 to another, and would otherwise destroy the necessary accuracy in the switching voltages from one comparator 40 to another in the assembly 10 of ADCs 18 as shown in FIG. 1. The offset differential voltage 109 between the bias voltage BV at line 108 and the switching voltage VSC at line 110 lies within the range indicated at 113 from the lower voltage at line 111 and the higher voltage at line 112. As was just mentioned, the bias voltage BV for the latch 74 in one comparator 40 may not be exactly the same as the bias voltage BV determined separately for the latch 74 in another comparator 40 in a multiple cell ADC assembly 10. Among the reasons for this are parasitic capacitive coupling and differences in the input offset voltage for the respective latches 74 of the multiple ADCs 18 in an assembly 10. However the auto-zeroing action of each comparator 40 of a given ADC 18 determines its own value of bias voltage BV which effectively compensates for any offset effects seen by it to give the switching accuracy and sensitivity indicated in FIG. 3A.

In FIG. 3, the output voltage from the latch 74 at output terminal 76 is connected to one side of a transmission gate 114 (also described as switch 114 or on-off switch 114). The switch 114 is controlled by a clock pulse CK and an inverted clock pulse CKN, the latter pulse CKN being obtained from the output of the inverter 89. The on-off switch 114 when "on", applies the voltage at the output terminal 76 to an input of a latch 116, (shown within a dashed-line box). The latch 116 comprises a first inverter 116a and a second inverter 116b connected back-to-back as shown. This latch 116 retains its current state after the switch 114 turns off. The latch 116 applies via a lead 117 the voltage level it is holding to an input of a voltage inverter-limiter 118 (shown within a dashed-line box and of a type well known in the art). Inverter-limiter 118 comprises a p-channel transistor 118a whose source is connected to a voltage VZH. The drains of transistors 118a and 118b are connected to a terminal at 119. The source of the transistor 118b is connected to a "low" reference voltage (VZL). The gates of transistors 118a and 118b are connected to the input lead 117. When the voltage on lead 117 is "high", inverter-limiter 118 applies to its output terminal 119 VZL, obtained ultimately from the master voltage reference, and when the voltage on lead 117 is "low", the inverter-limiter 118 applies to output terminal 119 a "high" voltage (VZH) similarly obtained. By choosing the values of voltages "VZL" and "VZH", the swing from "low" to "high" at output terminal 119 is conveniently determined. For example, if the voltage on lead 117 at the input to the inverter-limiter 118 swings from 0 to +5 volts (V) (low to high), the voltage at the output terminal 119 is made to swing from +3 to +2 V high to low with VZH = +3 V and VZL = +2 V. The voltage on terminal 119 is applied to a uniquely configured low pass, switched capacitor filter unit 120, (shown within the dashed-line box).

The switch/filter 120 comprises n-channel transistors 122, 124 and 142, p-channel transistor 128, 130 and 140, inverters 132 and 134 and capacitors 136, 138, 144 and 146. The drain and source of transistor 140 and a first terminal of the capacitor 144 are connected to a voltage source VDD. The drain and source of transistor 142, and first terminals of the capacitors 136, 138 and 146, are coupled to ground potential. The drains of transistors 122 and 128 are coupled to the terminal 119. The source of transistor 122 is coupled to the drain of transistor 124 and to a second terminal of capacitor 136. The source of transistor 128 is coupled to the drain of transistor 130 and to a second terminal of capacitor 138. The sources of transistors 124 and 130 are coupled to second terminals of capacitors 144 and 146, to the gates of transistors 140 and 142 and to a terminal 126. Terminal 126 is coupled via a conductor 148 to terminal 78. Phase P(2) is coupled to the input of inverter 132 whose output is coupled to the gate of transistor 128. Phase P(3) is coupled to an input of inverter 134 whose output is coupled to the gate of transistor 130.

The capacitor 136 is not a separate circuit element as such, but represents the combined depletion capacity and the gate to source capacitance of transistor 122 and the gate to drain capacitance of transistor 124. The same is true for the capacitor 138 and the transistors 128 and 130. These capacitors are each very small, for example about 5 femtofarads (fF), and are substantially equal to each other. In the absence of a phase P(2) or P(3), transistors 122, 124, and transistors 128 and 130 are in effect open switches. The capacitor 144, which is typically not a separate circuit element, represents the gate to drain-source capacitances of transistor 140. Similarly, capacitor 146 represents the same capacitances of transistor 142. Each of capacitors 144 and 146 has a value, for example, of about 2.5 picofarads, which is very much larger than either capacitor 136 or 138. The voltage on node 126 is able to move up or down between ground and VDD, but is nominally set at around half of VDD (e.g., half of 5 V). Since transistor 122 and transistor 128 are complementary, when they are switched on by phase P(2) and P(2)N (the output of inverter 132), they substantially equally and symmetrically charge the respective capacitors 136 and 138 to the "high" or "low" voltage then at terminal 119 (e.g., voltage VZH or VZL). Any error in charging the capacitors 136 and 138 caused by the switching "off" of transistors 122 and 128 is self-cancelling. For example, capacitor 136 may be left charged slightly lower than it should be, but capacitor 138 is left charged slightly higher, and vice-versa. Thereafter, when transistors 124 and 130 are turned on by phase P(3) and P(3)N (after transistors 122 and 128 are off), the charges on capacitors 136 and 138 are applied to terminal 126. The effect is to move terminal 126 slightly up or down in voltage by a very small amount because of the much larger values of capacitors 144 and 146. They are each about 500 times larger than either capacitor 136 or 138. The voltage on terminal 126 is thus a highly filtered analog voltage which is continually being adjusted on repeated phases P(2) and P(3) in response to the digital voltage being continuously switched high or low at the terminal 119 with each clock pulse CK. After the comparator 40 has initially operated for a number of cycles (a very short time) the analog voltage at terminal 126 asymptotes to a desired value and thereafter is the "auto-zeroed" bias voltage BV. This voltage BV is applied via a lead 148 to the bias terminal 78 of the latch 74. Of course, by virtue of the sequential on-off switching of the transistors 122, 128 and of transistors 124, 130 of the switch/filter unit 120, the bias voltage set at terminal 126 on phase P(3) is unaffected and remains unchanged (as the desired analog bias voltage BV at input terminal 78) throughout the remaining phases P(4) to P(15) of each full cycle of operation of comparator 40.

In FIG. 3, the auto-calibration reference voltage VRDA on lead 52 (see also FIG. 1) is obtained as follows. Also connected to the output 76 of the regenerative latch 74 through the switch 114 and the latch 116 is a lead 150. Lead 150 is connected to an input terminal 152 of a low pass, switched capacitor filter 154. This switch/filter 154 is substantially identical to the switch/filter 120 previously described. The switch/filter 154 has an output terminal 156 (similar to terminal 126) and the filter 154 is turned on and off in sequence by the phases P(3) and P(4) as indicated. The voltage at output terminal 156 is an analog voltage which, as will be described shortly, is referenced by the action of the comparator 40 to the master voltage reference. The analog voltage at the terminal 156 is applied to a source/follower 158 (shown within a dashed-line box) which is well known in the art. Source/follower 158 comprises two p-channel transistors 158a and 158b whose sources and drains are connected in series between the voltage source VDD and ground as shown. The gate of the transistor 158a is connected to the terminal 156 and the gate of the transistor 158b is connected to the voltage VREF. The drain of transistor 158b is coupled to the source of transistor 158a and to a terminal 159 which is coupled to a lead 52. The voltage at terminal 159 is the analog reference voltage VRDA, which is applied via the lead 52 to the LSB DAC 48 in FIG. 1.

In FIG. 3, input terminal 75 of the latch 74 is connected to a uniquely configured interconnecting circuit 160 (shown within a dashed-line box) which comprises part of the comparator 40. The circuit 160 applies in desired sequence to the input terminal 75 of the latch 74, various input voltages, as will shortly be described. The circuit 160 comprises first, second and third transmission gates (switches) 164, 174 and 176 each having first and second control terminals and an input and output terminal, and capacitors C1 and C2. Switch 164 has signals "PSMP" and PSMPN (the complement of PSMP) coupled to its control terminals. Similarly, signals "PVI" and "PVIN" and "PVR" and "PVRN" are coupled to the control terminals of switches 174 and 176, respectively. A reference voltage VREF, which is referenced to the master voltage reference, is coupled to a terminal 166 and to the input of switch 164. VREF is by way of example 2.5 V where the master voltage reference=5.0 V and is very accurate. VDD is also 5 V. The input of switch 174 is coupled to the input terminal 20 (also see FIG. 1) to which an analog signal VIN is applied. The switched reference voltage (SWVR) obtained via the lead 46 from the MSB DAC 44 (See FIG. 1) is applied to a terminal 178 which is coupled to the input of switch 176. The analog voltage DA is coupled to a terminal 180 which is coupled to a first terminal of C2. The outputs of switches 174 and 176 are coupled to a first terminal of C1. Second terminals of C1 and C2 are coupled to the output of switch 164 and to input terminal 75 of latch 74.

In FIG. 4A, a logic circuit 190 (shown within the dashed-line box) comprises a two input NOR gate 192, inverters 194, 195, 196 and 199, and a transmission gate 198. The first and second inputs of NOR gate 192 are coupled to phase signals P(0) and P(3), respectively. An output of NOR gate 192 is coupled to an input of inverter 194 whose output is coupled to inputs of inverter 195 and transmission gate 198 (biased on). An output of inverter 195 is coupled to an input of inverter 196 at whose output is generated the signal PSMP. An output of transmission gate 198 is coupled to an input of inverter 199 at whose output is generated the signal PSMPN (the complement of PSMP). Circuit 190 generates signals PSMP and PSMPN without there being any delay between these two output signals. This is achieved by selecting a transmission gate 198 which has essentially the same delay time as inverter 195.

In FIG. 4B, a cross-coupled logic circuit 200 (shown within a dashed-line box) comprises a first "NOR" gate 202, having an upper input terminal 203 (to which P(3) is applied), and a lower input terminal 204. An output of the NOR gate 202 is serially connected through a first inverter 206 and a second inverter 208 to a first output terminal 210 at which the signal PVR is generated. Connected to an output of the first inverter 206, via a lead 211 is a second output terminal 212 at which the signal PVRN (the complement of PVR) is generated. The circuit 200 further includes a second "NOR" gate 214 having a lower input terminal 215 to which P(4) is applied and an upper input terminal 216. An output of the NOR gate 214 is connected serially with a third inverter 218 and a fourth inverter 220 to a third output terminal 222. The signal PVI is generated at terminal 222. Connected to the output of the third inverter 218 via lead 223 is a fourth output terminal 224 at which the signal PVIN (the complement of PVI) is generated. The third output terminal 222 is cross-connected via lead 226 to the input terminal 204 of the first NOR gate 202. Similarly, the second output terminal 210 is cross-connected via a lead 228 to the input terminal 216 of the second NOR gate 214. When phase P(3) is applied to the terminal 203 of the first NOR gate 202, the connection from the terminal 210 to the terminal 216 of the second NOR gate 214 produces a signal PVI at the terminal 222. The circuit then stays latched in this condition until phase P(4). The signals PVI and PVIN are of proper polarity to turn on the switch 174 (see FIG. 3). However, the signals PVR and PVRN subsequently appear at the terminals 210 and 212 in negative polarity from that shown. As such they will not operate the transmission gate or switch 176 to which they are applied. Later, when phase P(4) is applied to the terminal 215 of the second NOR gate 214, the signals PVI and PVIN are reversed in polarity (and no longer hold "on" the switch 174) and signals PVR (true) and PVRN (complement) appear with proper polarity at the terminals 210 and 212. They will then turn on the switch 176. The timing of the signal PVI (and complement PVIN) relative to phases P(3) and P(4) and the signal PSMP (and complement PSMPN) of FIG. 4A is described below.

In FIG. 4C, a clock pulse (CK) having three pulses "CK 2", "CK 3", and "CK 4" and signals P(3), P(4), PSMP and PVI is shown. Clock pulse CK at a rising edge 66 generates the phase signal P(3) as indicated by the dashed arrowed line 71 (see also FIG. 2). Phase P(3) in turn generates the signal PSMP (FIG. 4A) and the signal PVI (FIG. 4B). For simplicity, the complements PSMPN and PVIN are not shown in FIG. 4C. When phase P(3) turns on signal PVI (as is shown by the arrowed line 230 in solid), it also turns on PSMP (as is shown by the arrowed line 231). The signal PVI, because of the cross-coupling of the logic circuit 200 (See FIG. 4B), remains on after P(3) turns off and until phase P(4) comes on. The turning off of signal PVI is shown in FIG. 4C by the arrowed solid line 232 from the beginning of phase P(4). Thus the duration of PVI is longer than the duration of PSMP as indicated at 236. The signal of PSMP here is turned off by phase P(3) as indicated by the line 237. The extra time that PVI is on is essentially equal to the time that the clock pulse CK3 is at a low level 62. The importance of this extra time for PVI will be explained shortly.

In FIG. 3, the voltage at the terminal 75 (T75) is determined by C1, C2 and the voltages VREF, VIN, SWVR and DA. It is expressed by an equation (1) as follows: $V(T75) = VREF + (SWVR - VIN) \times [C1/(C1+C2)] + DA \times [C2/(C1+C2)]$. The voltage at the terminal 75 thus responds to the difference between (SWVR+DA) and VIN. The effect of small variations in exact equality of capacitors C1 and C2 is compensated for in the auto-calibration loop running from the regenerative latch 74 via the lead 52 through the LSB DAC 48 and back via the lead 50 to the DA terminal 180, described previously. By automatically setting the effective gain "G" of the auto-calibration loop so that $G \times (C2/(C1+C2)) = C1/(C1+C2)$, the ratios of C1 and C2 given in the equation (1) are made equal. Long term thermal drift of capacitors C1 and C2 is also compensated for by the auto-calibration loop. The main requirement on the capacitors C1 and C2 is therefore that they form a linear summation of the voltages SWVR and DA.

Since the voltage at the terminal 75 is that which will actually cause the regenerative latch 74 to switch "low" or "high" at a given clock count, it is necessary, among other things, that the terminal 75 remain free of secondary parasitic effects. Thus it is important that the terminal 75 be disconnected from the VREF terminal 166 by the switch 164 slightly before the terminal 75 is disconnected from the VIN terminal 20 by the switch 174. This is achieved by the timing of signals PSMP and PVI (and their complements) as described previously in connection with FIGS. 4A, 4B and 4C. It is also necessary that the full settling time, due to the RC time constant at terminal 75, be allowed for during the auto-bias cycle which is initiated by phase P(0). Thus phase P(0) and the additional time of phase P(1) are allowed for auto-zeroing. Auto-calibration is provided for during phase P(2) and the sampling of the input voltage VIN is initiated on phase P(3).

In FIG. 5 a preferred embodiment of the SAR 42 of FIG. 1 comprises eleven essentially identical circuits (shown within the dashed line boxes) of the positions "10" through "0", corresponding to the 10-bits of data plus one offset bit. For convenience, the positions 10 to 4 are shown on the right of the drawing, and positions 3 to 0 on the left. The position "10" corresponds to the most significant bit and position "0" to the least significant bit in the SAR 42. Position "3" corresponds to an "offset" bit. For convenience a table shown in FIG. 5A summarizes these bit positions and gives the corresponding outputs "D(9)" to "D(0)" as also indicated in the respective positions shown in FIG. 5.

In FIG. 5, position 10 of the SAR 42 includes a first "NAND" gate 250 having an output at a terminal 252 which is cross-connected to an input 253 of a second "NAND" gate 254, the output of which, at a terminal 256, is connected to an input of an inverter 258 whose output is D(9). Terminal 256 is connected back to a first input 260 of the first NAND gate 250. When a second input 262 of the first NAND gate 250 is driven low via a lead 264 from an output of an inverter 266 whose input is coupled to and controlled by P(4), the output of the first NAND gate 250 at the terminal 252 goes high, and the output at the terminal 256 of the second NAND gate 254 goes low. This "low" is coupled back to the input 260 of the first NAND gate 250 so that its output at the terminal 252 is latched "high", and the terminal 256 held low. The inverter 258 then applies a high signal to its output D(9), which is equivalent to a binary "1" at position 10 of the SAR 42. The second NAND gate 254 has a second input terminal 268 which is connected to a buss 270 (drawn vertically) which is connected to the output of an inverter 272 which is coupled by an input terminal to phase P(0) and is controlled by phase P(0). When phase P(0) occurs, the buss 270 goes low and the second NAND gate 254 is actuated so that its output at the terminal 256 goes high. This "high" is coupled back to the first NAND gate 250 so that its output at the terminal 252 goes "low" and latches the circuit in this alternate condition. The output at D(9) is now "low", equivalent to a binary "0". The second NAND gate 254 has a third input terminal 272 which is connected to the output of a NAND gate 274. A first input 275 of this NAND gate 274 is connected to the lead 41 (drawn vertically), which lead applies the single digit output of the comparator 40 (see also FIG. 1 and FIG. 3) to the SAR 42. A second input terminal 276 of the NAND gate 274 is connected to a lead 278 which is coupled to and actuated by phase P(5). When input terminals 275 and 276 of NAND gate 274 are both driven "high", the NAND gate 274 pulls "low" the third input terminal 272 of the second NAND gate 254. This sets the terminal 256 "high" and the terminal 252 "low" leaving them in this state. Output D(9) is then low (a binary "0"). If, on the other hand, the level on lead 41 had been "low", representing a binary "1" from the comparator 40, the terminal 256 would have been left "low" on the occurrence of phase P(5), and the output at D(9) set high (a binary "1"). The terminal 256 is also connected to the gate of an n-channel transistor 280 whose source is grounded. The drain of the transistor 280 is connected to the source of a second n-channel transistor 282 whose drain is connected to a high impedance load (not shown) connected to VDD. The gate of transistor 282 is connected to a buss 284 which will be described shortly. When the transistor 280 is disabled (i.e., biased off), the drain of the transistor 282 goes "high" (near VDD). When the transistor 282 and the transistor 284 are both enabled (i.e., biased on), the drain of the transistor 282 stays low (near ground). The gate of the transistor 280 is held low when the terminal 256 is low and thus the transistor 280 is held off. The drain of the second transistor 282 is pulled high to give at an output terminal MD(9) a binary "0". If on the other hand, the transistor 280 is enabled by its gate being held high, the drain of the second transistor 282 will go low when its gate, which is coupled to buss 284 and phase P(15) goes high. This signals at output MD(9), a binary "0". It will be seen that the gate of the transistor 282 is connected to a buss 284 which is common to all of the positions "10" to "0" of the SAR 42. This buss 284 is controlled by the phase P(15) which when "on" outputs all of the 11 binary signals MD(9) to MD(0) then stored in the SAR 42. The signal at MD(0) of position "0" is outputted as a binary "0" only if the buss 41 goes low and holds an n-channel transistor 280 in the register position "0" in an off condition. These 11 binary bits from the SAR 42 are applied in parallel to the output terminal 22 of the ADC 18 and thence to the MUX unit 28 as shown in FIG. 1. These 11 binary bits, though in non-standard binary format, are an accurate digital representation of the analog signal voltage which has been sampled at the input terminal 20. They are applied by the MUX unit 28 to the format converter unit 32 (known in the art) where the 10 MSB and LSB bits are added to the 1 offset bit and they are converted to the standard binary format (10 bits).

Position 9 contains identical elements to those just described in connection with position 10. Of course, position 9 is actuated by phases P(5) and P(6), as shown instead of phases P(4) and P(5) which are used to actuate position 10. For position 8 NAND gate 290 thereof has an input terminal 292 connected to the buss 270. Thus when phase P(0) occurs and the buss 270 goes low, the output D(7) at position 8 goes high (a binary "1"). An upper input terminal 294 of the NAND gate 290 is connected through an inverter 296 (identical to the other inverters such as inverter 266) to receive an inverted phase P(6) signal. When phase P(6) occurs the output D(7) of position 8 is set to a binary "0". A NAND gate 298 of the position 8 has an input terminal 300 connected to a buss 302 which is connected through an inverter 304 to receive a phase P(2) signal as shown. When phase P(2) occurs, the output D(7) of position 8 is set to a binary "0". A NAND gate 306 of position 7 has an input terminal 307 which is connected to the buss 310. When phase P(2) occurs the output D(6) of position 7 is set to a binary "1". Positions 6, 5 and 4 are similarly connected to the buss 302 and are set to binary 1 by phase P(2). A NAND gate 308 of position 7 has an input terminal 309 connected to a buss 310 which in turn is connected to an output of a NOR gate 312. An input terminal 314 of NOR gate 312 is adapted to receive a phase P(0) and an input terminal 316 of NOR gate 312 is adapted to receive a phase P(3). Thus when either phase P(0) or P(3) is applied to NOR gate 312, buss 310 goes low and sets a binary 0 in position 7. Since positions 6, 5, and 4 are similarly connected to the buss 302, they are also set to binary 0 by phases P(0) and P(3). A NAND gate 318 of position 3 has an input terminal 320 connected through an inverter 322 to receive the inverse of the phase P(4) signal. A NAND gate 324 of position 3 has an input terminal 326 connected to the output of a NOR gate 328 whose two inputs are adapted to receive phases P(0) and P(9) as shown. Thus, whenever either phase P(0) or P(9) appears, the output D(3) at position 3 is set to binary 0. When phase P(4) occurs position 3 is set to binary 1 in a way similar to the setting of a binary 1 into position 8 by phase P(0).

In FIG. 5, the setting and/or re-setting of the cross-coupled NAND gates 250 and 254 of position 10 have been described in detail. The setting and/or re-setting of the cross-coupled NAND gates in the other positions "9" to "0" of the SAR 42 occur in similar fashion. The application of the phases P(0) to P(15) (but not P(1) which is not applied here) to the various elements in the SAR 42 is as indicated.

Figure 6:
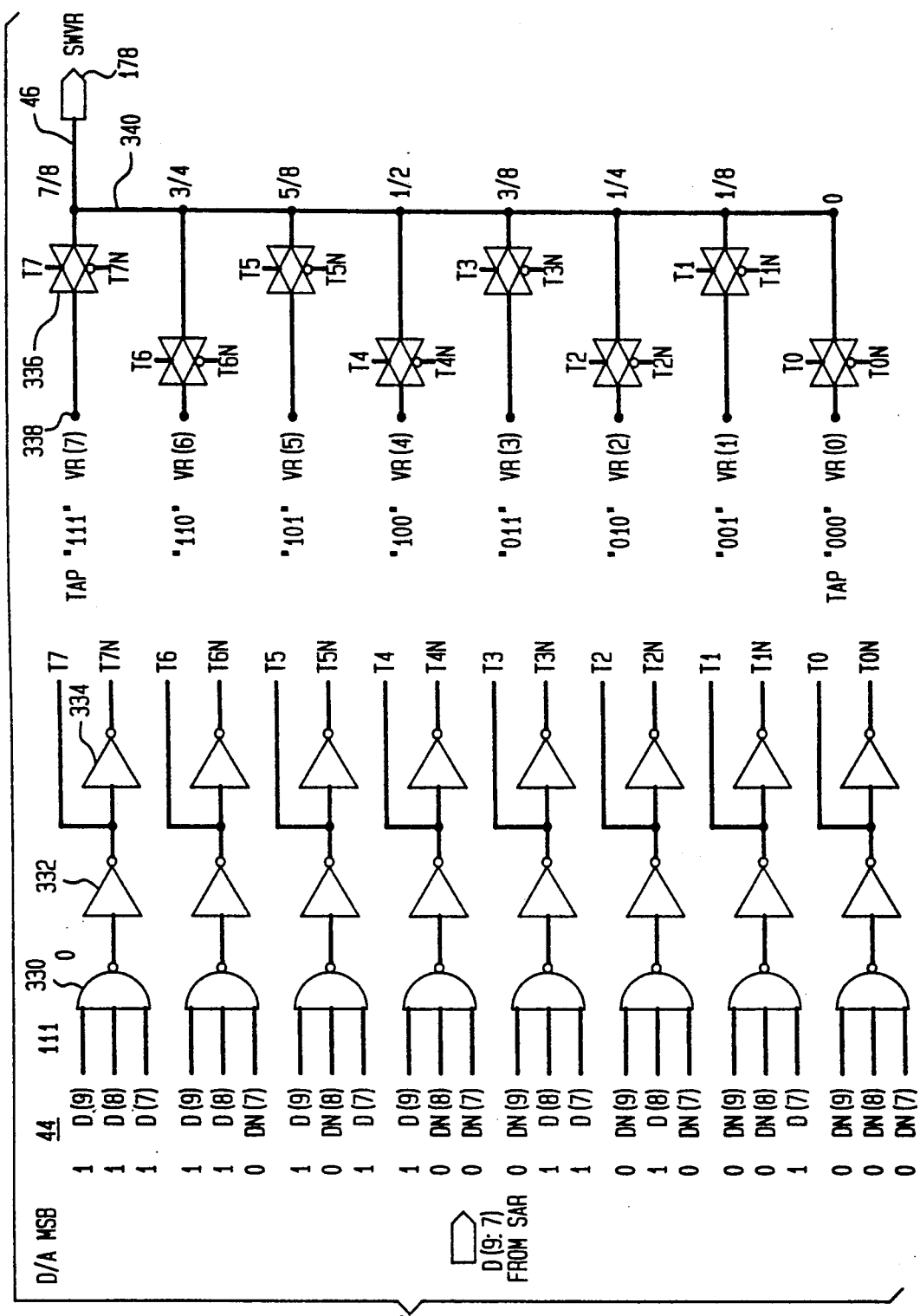
FIG. 6 is a circuit diagram showing a MSB DAC of the SAR in FIG. 5.

In FIG. 6, a preferred embodiment of the MSB DAC 44 (FIG. 1) shows the input binary code of the three more significant bits (MSB) digits D(9), D(8) and D(7) (see FIG. 5 and 5A) and their eight decoded equivalents. Thus for the input signal binary "111", there are obtained from the SAR 42 the outputs D(9), D(8) and D(7) which are applied here in FIG. 6 to a first NAND gate 330. The output of gate 330 is applied to a first inverter 332 to obtain at an output of inverter 332 an output signal "T7". The output of the first inverter 332 is applied to an input of a second inverter 334 at the output of which is generated a signal "T7N" (the complement of T7).

In FIG. 6, there are also seven identical circuits corresponding respectively to the binary codes "110" through "000" of the outputs D(9), D(8) and D(7). These circuits respectively produce the signals "T6" (and its complement T6N) through "T0" and "T0N". Similarly, the signals "T6", "T6N" through "T0" and T0N" are connected to a series of seven switches (identical to the switch 336), each of which is connected to a corresponding one of the taps VR(6) through VR(0) as shown. The signals T7 and T7N are applied to control terminals of a first transmission gate (switch) 336. The input of switch 336, at a terminal 338, is connected to a tap VR(7) of a precision resistor voltage divider (not shown). The taps VR(7) to VR(0) are each equally separated in voltage from each other. An eighth tap (not shown) is connected to the master voltage reference (not shown). Thus, tap VR(7) is ⅞ths of the master voltage reference, and tap VR(1), corresponding to the binary "001", is ⅛th the value. The switch 336, and seven other switches (with no reference numbers shown) like it, are connected to a buss 340 which in turn becomes the lead 46. The lead 46 applies the switched reference voltage SWVR to the input terminal 178 (also see FIG. 3) of the comparator 40. By way of example, the master voltage reference may be 5V exactly, and thus tap VR(1) is ⅛th of this value. The MSB DAC 44 thus converts into their analog equivalents, represented by voltage SWVR (accurately referenced to the master voltage reference), the binary bits of the positions 10, 9, and 8 of the SAR 42. Similarly, the LSB DAC converter 48 (FIG. 1) converts the binary bits of positions "7" to "0" of the SAR 42 into their analog equivalents as the analog voltage DA. The referencing of this voltage (auto-calibration) to the master voltage reference will now be described.

In FIG. 3, the auto-calibration loop (including switch/filter unit 154, lead 52 and voltage VRDA, and lead 50 and voltage DA) has previously been described. The auto-bias voltage BV has now already been set to a desired value (phases P(0), P(1)). Positions "10", "9" and "8" of the SAR 42 (FIG. 5) are set to binary "001" so that voltage SWVR is at ⅛th (FIG. 6). Upon initiation of the phase P(2), the four positions "7", "6", "5" and "4" of the SAR 42 are set to binary "1111" (positions "3", "2", "1" and "0" are set "0000"). At this point it should be noted that in a standard binary bit format, the first three positions 10, 9 and 8 of the SAR 42 represent ⅞ths of a total. That is, position 10 represents ½, position 9 represents ¼th, and position 8, ⅛th for a sum of ⅞ths. Position 7 represents 1/16th, the next, 1/32nd, and position 5, 1/64th, and so on. However, by arbitrarily assigning to position 4 a value of 1/64th (instead of 1/128th), the combined weight of binary "1's" in positions 7, 6, 5 and 4 equals exactly ⅛th. Thus the analog value (i.e., the analog voltage DA) of these four bits when set "1111" can be compared to the analog voltage SWVR when it is set to ⅛th. If there is any difference then the auto-calibrating loop (described previously) automatically eliminates the difference by adjusting the voltage VRDA and hence the voltage DA. The positions 7, 6, 5, and 4 of the SAR 42 are set "1111" on phase P(2), and position 8 reset to "0" at this time, and positions 10, 9, 3, 2, 1, 0 are already set to binary "0".

In FIG. 3, the input voltage VREF at input terminal 166 was applied at phase P(0) to terminal 75 by turning on the switch 164 as previously described (FIG. 4A). This charges the capacitor C2 to the difference in voltage between VREF and the voltage DA at terminal 180 (which on phase P(0) was set to zero). The capacitor C1 was charged to the difference between the voltage VREF and the voltage SWVR, the switch 176 being on at this time (see FIG. 4B). The voltage SWVR is set to ⅛th during phase P(0). Later, on phase P(2), when the voltage SWVR is set to zero and the voltage DA set to ⅛th, since capacitors C1 and C2 are effectively equal the voltage on the terminal 75 does not change (assuming the voltage DA is exactly equal to ⅛th). This voltage DA (for a bit value "11110000" applied to the LSB DAC 48) will have previously asymptoted, through the action of the auto-calibrating loop, to ⅛th of the master voltage reference (in a manner identical to the asymptoting of the bias voltage BV during auto-biasing). Any small difference between SWVR and DA is detected and voltage DA adjusted accordingly by the action of the auto-calibrating loop. Thus the analog voltage DA is accurately referenced (against voltage SWVR) to the master voltage reference.

The extra weight assigned to the bit of position 4 of the register is equal to 1/128th (half of 1/64th). This extra weight is used as offset compensation to enable the comparator to operate at much higher speed. Because the time required for the charging to a voltage by a resistance-capacitance (RC) network is determined by the RC time constant, the voltage on terminal 75 (FIG. 3) does not instantly change to the charging voltage. There is a delay called "settling time", and it is related to the RC time constant and the voltage change. By initially adding a small "offset" voltage into the analog voltage DA at terminal 180, during the cycles that the higher values of the MSBs (and the next several LSBs) are being determined, comparator 40 can operate accurately at a rate faster than the "settling time" would otherwise permit. That is, the comparator, by virtue of this small compensating voltage (temporarily added to analog voltage DA), can make an accurate determination of these higher value bits at much higher speed (e.g., twice as fast) than would be possible if the comparator were delayed in its sampling by the full amount of the settling time. As the voltage "change" at terminal 75 (see equation (1)) becomes smaller and smaller, meaning that more and more "bits" have been determined by the SAR 42, the settling time decreases. At a suitable point in the operation of the SAR 42 the offset compensating voltage is removed, and the comparator 40 still operate accurately at the high speed it is being clocked at.

When the comparator 40 is sampling the terminal 75 sooner than the settling time would otherwise permit, the comparator (without the "offset") may make an error (settling time error) either high or low. For example, if the input voltage at the terminal is greater than the binary value "½", but the comparator errs so that "½" is not included in the partial sum of the binary digits, then the maximum binary value of the remaining digits in the partial sum will always be less than "½". On the other hand, if the input voltage is less than the value "½", but the comparator errs so that "½" is included in the partial sum, then there is no way to reduce the partial sum using lower order bit values. Settling time errors are avoided by choosing an appropriate value of offset voltage (VO). The value of VO is relatively small (e.g., 1/64th in weighted value), but is large enough so that in determining the higher order bits (where the voltage changes on the terminal 75 may be relatively large and hence "settling times" longer) settling time is compensated for. By adding a voltage VO/2 to the analog voltage DA, the weighted value for the bits contributing to the partial sum in SAR 42 converges to VIN−VO/2. After determining the partial sum for bits which are weighted with values greater than VO, the VO/2 offset on analog voltage DA is removed, and an extra clock cycle is provided. This extra cycle enables the comparator 40 to determine whether the weighted value of the offset voltage VO should be added to the partial sum in the SAR 42 or left out. If added, then the error in the partial sum will be zero. If left out, the error will be −VO/2. Then on the next cycle, the next bit with a weighted value of VO/2 will either be left out or added to the partial sum. If added, an error of −VO/2 of the previous sum will be corrected; if left out no error needed to be corrected. In either case, VIN, without offset error, is now represented by the bits up to this point. The remaining lower order bits of the partial sum are then determined in order to obtain the N+1 bit value of VIN.

In the SAR 42, the voltage VO has a binary weight represented by position 4 (1/64th), and VO/2 has the binary weight of position 3 (1/128th). A bit at position 3 is either added or not at phase P(12) depending on whether the comparator error is zero or −VO/2. Thereafter, because settling time is no longer a concern, as explained above, the comparator 40 continues on its regular clock cycle in determining the remaining bits without any offset (no longer needed).

In FIG. 3, all of the "bits" of the SAR 42 are set to binary "0" when phase P(3) begins. The comparator 40 will have previously set the bias voltage BV, and the analog voltage DA (with offset) to desired values as previously described. Phase P(3) initiates the sampling of VIN by referencing it to VREF, SWVR and DA at the terminal 75 (see equation 1). The switches 164, 174, and 176 are turned on and off at phase P(3) as previously explained (see FIGS. 4A, 4B, and 4C). Then the comparator 40, at the beginning of clock pulse CK4, determines whether the voltage is higher or lower than the auto-zero switching voltage VSC. If lower, indicating a binary "1" for the first bit, corresponding to position 10 of the SAR 42, lead 41 goes low. Phase P(4) unconditionally sets position 10 to a binary "1". If lead 41 is low when phase P(5) occurs, position 10 remains at a binary "1". However if lead 41 is high (indicating that the first bit in the SAR 42 should be a binary "0"), phase P(5) and the "high" on lead 41 re-set position 10 to a binary "0". This procedure is then repeated phase after phase until all of the bits in the register are set. It should be noted that on phase P(14) position 0 is set to a "1" and on phase P(15) this bit is read either as a "1" or a "0" depending on whether lead 41 is low or high at that time, as was previously explained (FIG. 5).

In FIG. 7, there is shown in summary table form the sequence of setting and re-setting of the bits in the SAR 42 phase by phase. After a complete cycle of the sixteen phases P has been completed, another cycle is begun. Looking at the location in the table corresponding to position 10 and phase P(4), the symbol 1/S shown indicates that the bit at this position 10 is conditionally set to a "1", and then on the following phase P(5) "set" (S) to its final value (either a "1" or "0").

At phase P(9) the offset compensating voltage on the analog voltage DA is removed by re-setting the "1" bit which had been present in the position 3 to a "0". Then, on phase P(10), the offset compensating bit (representing VO) at position 4 is set to a "1" and on phase P(11) is "set"(S). On phase P(11) the bit at position 3 (representing VO/2) is set to "1" and on phase P(12) is "set" (S) to its final value. At phase P(15) all of the "set" (S) bits in the 11 positions of the SAR 42 are outputted, as explained previously.

It is to be understood that the embodiments of architecture and circuits described herein are illustrative of the general principles of the invention. Modifications may readily be devised by those skilled in the art without departing from the spirit and scope of the invention. For example, circuit elements may be changed and the value of offset compensation may be different from that shown. Moreover the invention is not restricted to a particular speed or resolution or number of bits in a word, or to the number of ADCs in a parallel assembly. Still further, the ADC 18, with only one of same being used, does not require a MUX 28 and includes a format converter (adder) 32 so as to provide a standard output format. Furthermore, in some applications the DACs 44 and 48 can be combined into a single DAC and conductors 50 and 52 and their connections eliminated. In some other applications which use just a single DAC, a calibration line 52 is useful.

What is claimed is:

1. An analog to digital converter (ADC) having N bit resolution comprising:
   an N+1 bit successive approximation register having an input terminal and N+1 output terminals with N bit resolution;
   a first digital to analog converter (DAC) having an output terminal and having an input terminal coupled to a first sub-set (M) of the N+1 output terminals of the N+1 bit successive approximation register (SAR), where M is less than N;
   a second DAC having a calibration input terminal and an output terminal and having N−M+1 input terminals which are coupled to N−M+1 output terminals of the N+1 bit SAR; and
   a comparator having a first input terminal adapted to receive an analog signal, a second input terminal coupled to the output of the first DAC, a third input terminal coupled to the output terminal of the second DAC, a first output terminal coupled to an input terminal of the N+1 bit SAR, and a second output terminal coupled to the calibration input terminal of the second DAC.

2. The ADC of claim 1 further comprising adding means, which has input terminals coupled to the output terminals of the N+1 bit SAR, for adding one bit from one of the output terminals of the N+1 bit successive approximation register to the remaining N bits from the other output terminals of the N+1 bit SAR so as to generate a output which comprises N bits.

3. The ADC of claim 2 further comprising:
   a plurality of additional essentially identical ADCs with all the first input terminals thereof being coupled together; and
   a multiplexer having input terminals coupled to the output terminals of each of the N+1 SAR and having output terminals coupled to the input terminals of the adder means.

4. An analog to digital converter (ADC) having N bit resolution comprising:
   an N+1 bit successive approximation register (SAR) having an input terminal and N+1 output terminals with N bit resolution;
   a first digital to analog converter (DAC) having an output terminal and having an input terminal coupled to a first sub-set (M) of the N+1 output terminals of the N+1 bit SAR, where M is less than N;

a second DAC having a calibration input terminal and an output terminal and having N−M+1 input terminals which are coupled to N−M+1 output terminals of the N+1 SAR; and a comparator having a first input terminal adapted to receive an analog signal, a second input terminal coupled to the output of the first DAC, a third input terminal coupled to the output terminal of the second DAC, a first output terminal coupled to an input terminal of the N+1 bit SAR, and a second output terminal coupled to the calibration input terminal of the second DAC; and the comparator is an auto-zero comparator comprising:

means for generating a data input reference voltage level and first data input signals which have voltage levels greater than the input reference voltage level and second data signals which have voltage levels less than the input reference voltage level;

a clocked latch circuit having a data input terminal, a reference voltage input terminal, and an output terminal, the clocked latch circuit being adapted to generate output logic states when clocked on, and further being adapted to maintain the output logic state achieved from the first or second data signals applied to the data input terminal thereof when same is clocked on even if the data signal changes; and feedback and voltage reference means, which has an input coupled to the output of the clocked latch circuit and has an output coupled to the reference input terminal of the clocked latch circuit, for setting a voltage level at the output terminal thereof when the clocked latch circuit is clocked on and the data input reference voltage of the generating means is coupled to the data input terminal to a voltage level which is essentially equal to the level of the data input reference voltage such that, when input data signals are coupled to the data input terminal of the clocked latch circuit and it is clocked on, the clocked latch circuit switches output states when the data input signal is above or below the data reference voltage level.

5. An analog to digital converter (ADC) having N bit resolution comprising:

an N+1 bit successive approximation register (SAR) having an input terminal and N+1 output terminals with N bit resolution;

an N+1 bit digital to analog converter (DAC) having a calibration input terminal and calibration output terminal and an output terminal and having input terminals coupled to the N+1 output terminals of the N+1 bit SAR; and a comparator having a first input terminal adapted to receive an analog signal, a second input terminal coupled to the output of the N+1 bit DAC and a third input terminal coupled to the calibration output terminal of the DAC, and a first output terminal coupled to an input terminal of the N+1 bit SAR and a second output terminal coupled to the calibration input terminal of the DAC.

6. An analog to digital converter (ADC) having N bit resolution comprising:

a successive approximation register (SAR) having an input terminal and output terminals with N bit resolution;

a digital to analog converter (DAC) having an output terminal and having input terminals coupled to the output terminals of the SAR;

a comparator having a first input terminal adapted to receive an analog signal, a second input terminal coupled to the output of the DAC, and a first output terminal coupled to an input terminal of the SAR; and offset compensation means for generating an offset compensating signal which is coupled to the comparator so as to compensate for settling time errors.

7. An analog to digital converter (ADC) comprising:

comparator means having an input for sampling an input analog voltage during successive cycles of operation and for generating a succession of bit outputs each of which is either a binary 0 or 1 depending on whether the input analog voltage is below or above a given voltage, the voltage at the input being subject to settling time;

timing means for driving the comparator means with clock pulses having a duration; and offset compensating means for applying to the comparator input in a successively decreasing amount an offset voltage such that errors are limited in the high speed sampling of the input analog voltage by the comparator means, and such that the clock duration is made substantially shorter than the settling time, whereby the ADC operates accurately at a speed substantially higher than the settling time would otherwise permit.

8. The ADC of claim 7 wherein the offset compensating means comprises successive approximation register (SAR) means having respective bit positions for a binary word of N bits plus an extra position for a bit having a weighted value corresponding to the small offset voltage.

9. The ADC of claim 8 further comprising digital to analog converter (DAC) means driven by the register means, the DAC means having an output to which it applies the small offset voltage in accordance with the weighted value of the offset bit.

10. The ADC of claim 9 further comprising auto-calibration means for accurately referencing the output of the DAC means.

11. The ADC of claim 10 wherein the auto-calibration means comprises feedback loop means from the high speed comparator means through the DAC means, the feedback loop means automatically referencing the output of the DAC to an accurately determined voltage.

12. An analog to digital converter comprising:

comparator means having input means for receiving an analog input voltage and having an output to which it applies a binary bit output the value of which depends on whether the analog input voltage is above or below a set voltage;

first referencing means for referencing the set voltage to a master voltage reference;

successive approximation register (SAR) means for receiving the output of the comparator means and for accumulating and storing partial sums of bits in a binary word of N bits;

timing means for driving the comparator means and the register means through a complete cycle of operation during which the N-bits are accumulated in the register means;

digital to analog converter (DAC) means driven by the register means and providing in accordance with a weighted partial sum of bits from the register means an output analog voltage;

second referencing means for referencing the output analog voltage of the DAC means to a master voltage reference;

feedback means for applying the output analog voltage of the DAC means to the input means of the comparator means;

a voltage terminal to which the input analog voltage is applied;

a first switch connected between the voltage terminal and a first input to which a reference voltage is applied;

a first capacitor one side of which is connected to the voltage terminal;

a second switch connected to the other side of the first capacitor and a second input terminal for receiving an input signal which is to be sampled and digitized; and a third switch connected to the other side of the first capacitor and a third input terminal to which is applied the analog voltage from the DAC means, the first, second and third switches being actuated in a desired sequence of on and off by the timing means such that the voltage at the voltage terminal is successively changed up or down and the N bit values are accurately determined.

13. An analog to digital converter (ADC) comprising:

an input connection circuit having a first, a second, a third and a fourth input terminal connectable to a voltage reference, an input analog signal, a first analog feedback voltage, and a second analog feedback voltage, respectively, the connection circuit having a common terminal, a first switch connected between the first input terminal and the common terminal, a first capacitor and a second capacitor one side of each being connected to the common terminal, a second switch connected between the second terminal and the other side of the first capacitor, a third switch connected between the other side of the first capacitor and the third input terminal, the other side of the second capacitor being connected to the fourth terminal;

latch means having an input and an output terminal, the input terminal being connected to the common terminal;

bit register means having an input connected to the output of the latch means, the register means accumulating and storing in respective positions the bits of an N-bit word representing the value of the input analog signal, the register having initial positions representing the most significant bits of a word, and having subsequent positions representing the least significant bits of a word;

first digital to analog converter (DAC) means actuated by the most significant bit positions of the register and having an output providing a first analog voltage representing the most significant bits;

second DAC means actuated by the least significant bit positions and having an output providing a second analog voltage representing the least significant bits;

applying means for applying the first and second analog voltages to the third and fourth input terminals respectively; and timing and control means for actuating the latch means, the register means and the first, second and third switches in an algorithm providing a desired sequence of operation, such that the converter operates accurately at high speed with high resolution.

14. The ADC of claim 12 wherein the register has an extra offset bit position and the weighted bit value of the offset bit is 1/128th, and the number of bit positions is $N+1$.

15. The ADC of claim 13 wherein the timing and control means provides 16 separate phases and the sequence of operation is according to the chart of FIG. 7 of the drawings.

16. The ADC of claim 12 in further combination with format conversion means for translating the $N+1$ bits from the register means into a standard N bit format.

17. The ADC of claim 13 further comprising a plurality of identical ADCs connected for operation in parallel, all of the converters being actuated by a single one of the timing and control means, each converter operating in a sequence skewed by at least one clock count relative to a preceding ADC, and all of the ADCs are connected to a single master voltage reference.

18. The ADC of claim 12 wherein the latch means includes an input bias terminal and in further combination with:

auto-bias means connected from the output terminal of the latch means to the bias terminal; and the auto-bias means comprising switch/filter means driven by a digital signal from the latch means and supplying an analog bias voltage accurately referenced by the latch means to the reference voltage at the first input terminal of the input connection circuit, the auto-bias means being driven by the timing and control means on clock counts subsequent to the actuation of the first switch connecting the first terminal of the connection circuit to the terminal, such that the bias voltage is accurately referenced to the reference voltage and the latch means switches at an accurately set point regardless of slight variations in component values in the latch means.

19. An analog to digital converter (ADC) comprising:

input circuit means having a first and a second input terminal and an output terminal;

comparator means connected to the output terminal and having a switched output;

successive approximation register means having an input connected to the switched output, the register means having N bit positions for storing respectively the N bits of a binary word and having an additional bit position for providing offset compensation, each of the bit positions having an output;

digital to analog converter (DAC) means connected to the output of at least the offset compensation bit position, the DAC means providing an analog voltage corresponding to the weighted value of the offset bit output applied to it;

means for applying the analog voltage to one of the input terminals of the input circuit means;

means for applying an analog input signal to be sampled to another of the input terminals;

auto-calibration means for controlling the DAC means and for accurately referencing the analog voltage to a voltage reference; and timing and control means providing successive phase signals for operating the comparator means and the register means in a cycle of operation, the timing and control means and the register means operating according to a predetermined algorithm which removes the weighted value of the offset bit from the output of the DAC means when the most significant bits of the N bits in the register have been determined.

20. The ADC of claim 18 wherein the DAC means is driven by a majority of the outputs of the bit positions of the register means.

21. An analog to digital converter (ADC) assembly comprising:
a plurality of ADCs having inputs and outputs connected in parallel;
timing means for driving each of the ADCs with clock pulses and with skewed phase pulses; and
multiplex means connected to the outputs of each of the ADCs and having an output;
each of the ADCs comprising:
comparator means having an input, an output and a switching level;
means to automatically adjust the bias of the comparator means to set the switching level at a single referenced voltage value;
register means connected to the comparator output and having a plurality of outputs connected to the multiplex means, the register means accumulating a partial sum of bits in an N bit word and storing the bits from the most significant to the least significant in N positions; and
switching feedback means from the register means to the comparator means for successively comparing the weighted value of the partial sum of bits in the register means to an analog signal at the comparator input such that each of the ADCs has a switching point accurately determined by the single referenced voltage value.

22. The assembly of claim 20 wherein each of the ADCs is driven by the timing means in skewed relation by at least one clock pulse from one ADC to the next such that each of the comparator means is connected one at a time to the parallel connected inputs of the ADCs.

23. The assembly of claim 20 wherein the switching feedback means comprises:
analog means to generate an analog voltage, the analog means being connected to the register and producing an analog voltage corresponding to the weighted value of the partial sum of bits in the register;
a first capacitor having one side connected to the input of the comparator means;
a first switch connected between the analog means and at the other side of the capacitor; and
a second switch connected between the other side of the capacitor and the parallel connected inputs of the ADCs, the first and second switches being turned on and off in a desired sequence by the timing means.

24. The assembly of claim 22 wherein:
the switching feedback means further comprises offset compensation means for adding a small offset voltage to the comparator means while the comparator and register means are determining the partial sum of the more significant bits in the N-bit word; and
the offset compensation means having an offset voltage source, and a second capacitor connected between the source and the input of the comparator means.

25. The assembly of claim 23 wherein the offset compensation means further comprises means to reduce the offset voltage to zero when the most significant of the N bits of a word have been determined by the comparator and register means.

26. An analog to digital converter (ADC) comprising:
comparator means having an input for sampling an input analog voltage during a cycle of operation and for generating a binary word of digital output bits in accordance with the analog voltage;
successive approximation register means connected to the comparator means and having a plurality of bit positions corresponding to a binary word, the register means successively storing as weighted bit values in partial sums the comparator digital output bits;
digital to analog converter (DAC) means driven by the register means for generating at least one analog reference voltage, the analog reference voltage corresponding to a weighted bit value of a partial sum of bits;
timing means for generating a plurality of clock and phase signals to drive the comparator means and the register means through a cycle of operation; and
input connecting and switching means having a first input for receiving an analog signal to be sampled, having a second input for receiving the analog reference voltage from the DAC means, and having an output connected to the input of the comparator means, the connecting and switching means in a desired sequence being controlled by the timing means applying the first input and the second input to the input to the comparator means.

27. The ADC of claim 25 wherein the timing means generates clock pulses having a duration, and further generates a plurality of phase signals, each of which is skewed by one clock count for a cycle of operation, there being at least as many phase signals as there are bits in the binary word.

28. The ADC of claim 26 further comprising a plurality of identical ADCs connected for parallel operation and providing an assembly, each of the plurality of ADCs being driven by the timing means in a respective cycle of operation skewed by at least clock count relative to a preceding ADC such that the input analog voltage is sampled successively by each of the plurality of ADCs during a cycle of operation of a first of the plurality of ADCs.

29. The ADC of claim 27 wherein:
the register means of each of the ADCs has an output which is provided with a completed sum of digits in the binary word once during a cycle operation; and
in further combination with:
multiplex means connected to the output of each of the ADCs, the multiplex means having an output to which it applies in sequence all of the binary words from the plurality of ADCs.

30. An auto-zero comparator comprising:
means for generating a data input reference voltage level and first data input signals which have voltage levels greater than the input reference voltage level and second data signals which have voltage levels less than the input reference voltage level;

a clocked latch circuit having a data input terminal, a reference voltage input terminal, and an output terminal, the clocked latch circuit being adapted to generate output logic states when clocked on, and further being adapted to maintain the output logic state achieved from the first or second data signals applied to the data input terminal thereof when same is clocked on even if the data signal changes; and feedback and voltage reference means, which has an input coupled to the output of the clocked latch circuit and has an output coupled to the reference input terminal of the clocked latch circuit, for setting a voltage level at the output terminal thereof when the clocked latch circuit is clocked on and the data input reference voltage of the generating means is coupled to the data input terminal to a voltage level which is essentially equal to the level of the data input reference voltage such that, when input data signals are coupled to the data input terminal of the clocked latch circuit and it is clocked on, the clocked latch circuit switches output states when the data input signal is above or below the data reference voltage level.

31. A high speed comparator for an analog to digital converter (ADC) comprising:

latch means, which has a signal input, a bias input, and an output, for rapidly switching the output either high or low depending on whether the voltage on the signal input is higher or lower than a bias voltage on the bias input;

clock means to reset the latch means for a switching operation;

input means for selectively applying a voltage to be sampled or a reference voltage to the latch signal input;

auto bias means for setting at a desired level for high sensitivity and switching speed a bias voltage on the latch bias input, the auto bias means being coupled between the latch output and the bias input; and voltage reference feedback means comprises the latch means, the input means and the auto bias means for referencing the bias voltage at the latch bias input to an accurately determined reference voltage such that the latch means switches high or low at a voltage very closely corresponding to the reference voltage.

32. The comparator of claim 30 wherein the latch means comprises complementary p-channel and n-channel transistors regeneratively cross-coupled and symmetrically balanced such that the latch means switches very rapidly after being reset by the clock means, and such that the latch means is highly sensitive to voltage at the latch signal input, and has a high degree of immunity to common mode noise.

33. The comparator of claim 30 further comprising:

analog means for applying to the input means an incrementally changing voltage level; and calibration feedback means from the latch output to the analog means for accurately controlling the changing voltage level of the analog means.

34. The comparator of claim 32 wherein the analog means further applies a small offset compensating voltage to incrementally change the voltage level such that settling time errors in the switching of the latch means are limited, and the comparator provides high resolution, high accuracy and high speed.

35. A high speed comparator comprising:

a latch having an input terminal to receive an input voltage, an output terminal to which the latch applies a digital voltage in binary form, and a bias terminal;

means to set the voltage at the bias terminal at a desired value for the latch to operate with high sensitivity;

interconnecting means having a voltage terminal connected to the latch input, having a first, a second, a third and a fourth input terminal, having a first switch connecting the first terminal to the voltage terminal, having a second switch connected to the second input terminal, having a first capacitor connected between the second switch and the voltage terminal, having a third switch connected between the first capacitor and the third input terminal, and having a second capacitor connected between the voltage terminal and the fourth input terminal;

first feedback means from the digital output of the latch to apply a first analog voltage to the third terminal of the interconnecting means;

second feedback means from the digital output of the latch to apply a second analog voltage to the fourth terminal of the interconnecting means; and timing means for actuating the latch and the first, second and third switches in a desired sequence, such that an analog signal applied to the second input terminal may be sampled at high speed, and the operation of the latch is accurately determined by sequential reference to a reference voltage applied to the first input terminal, and to the first and second analog voltages applied to the third and fourth terminals.

36. The comparator of claim 34 wherein the means to set the bias voltage comprises third feedback means connecting the digital output of the latch to the bias terminal of the latch, the third feedback means being actuated by the timing means after the first switch in the interconnecting means has applied a reference voltage to the terminal of the interconnecting means, such that the bias voltage is very accurately set at a desired value which ensures both accurate and high speed operation of the latch.

37. The comparator of claim 35 wherein the third feedback means includes a switch/filter unit having an input which receives a digital input related to the output of latch, and provides at an output a highly filtered analog voltage to the bias terminal of the latch, the switch/filter unit comprises a small input capacitor and a much larger output capacitor, the small capacitor being switched to the input of the switch filter unit and subsequently being switched to the larger capacitor, the larger capacitor being connected to the output of the switch filter unit.

38. A high speed comparator comprising:

a regenerative latch having complementary p-channel and n-channel transistors connected in two symmetrical parallel pairs between a supply voltage terminal and a common connection, a transistor of one of the pairs having its gate connected to an input terminal, the other of the pairs having a gate connected to a bias terminal, a first terminal between one pair of transistors and a second terminal between the other pair of transistors, the first and second terminals being cross-connected to the respective gates of the two remaining transistors the latch having an input voltage switching point;

coupling means connected between one of the terminals and an output terminal;

first switch means connected to the terminals and to the supply voltage terminal;

second switch means connected between the common connection and ground;

clock means to turn off the first switch means and to turn on the second switch means to allow the terminals to clear the supply voltage, and then to turn on the second switch means and turn off the first switch means; and auto-bias feedback means connected from a reference voltage terminal, through the latch to the output of the coupling means, and back to the bias terminal, the auto-bias means being actuated on successive clock counts from the clock means, the auto-bias feedback means applying an analog bias voltage to the bias terminal of the latch which is accurately referenced to the reference voltage such that the latch has an automatically determined input voltage switching point regardless of slight variations in the characteristic of the p-channel and n-channel transistors.

39. The comparator of claim 37 further comprising balancing means connected to the other of the terminals and having a capacitance substantially equal to that of the coupling means.

40. The comparator of claim 38 in which the auto-bias means includes switch and filtering means connected between the output of the coupling means and the bias terminal, and the auto-bias means comprises third switch means for selectively coupling the input of one of the pairs of transistors of the latch to a reference voltage terminal, such that the bias voltage is held accurately referenced to the reference voltage during successive cycles of operation of the comparator.

41. The comparator of claim 39 further comprising input switching means for separately applying to the input of the latch a voltage representative of an input analog signal, such that after the bias voltage has been set, the latch accurately determines the digital value of the analog signal during successive cycles of operation.

42. The comparator of claim 39 in which the switch and filtering means comprises a first pair of complimentary transistors having a common input and having respective outputs, the common input of the first pair of transistors being referenced to the output of the coupling means, the first pair of transistors being switched on by a clock signal from the clock means, the second pair of transistors being switched on by a subsequent clock signal from the clock means, such that the common terminal is moved up or down incrementally at the subsequent clock signal.

43. A high speed comparator comprising:
input circuit means having a first input and a second input and an output terminal which moves high or low in voltage and is subject to switching transients and settling time;

latch means having an input connected to the circuit output terminal, the latch having an output, the latch switching the output either high or low in accordance with whether the latch input is either higher or lower than a predetermined voltage;

offset compensation means for generating an offset compensation voltage to reduce settling time errors in the switching of the latch means;

auto-comp means for automatically applying the offset voltage to the first input and for removing the offset voltage as the output terminal is moved closer and closer to the predetermined voltage;

voltage means for applying a progressively decreasing signal voltage to the second input of the circuit means; and timing and control means providing a succession of clock signals for driving the latch means, and the auto comp means, such that the latch means accurately operates at high speed despite a settling time having a duration much longer than that of a clock signal.

44. The comparator of claim 42 wherein the second input of the input circuit means comprises a capacitor having one side which is connected to the output terminal, and a switch connected to the other side of the capacitor and to the voltage means, the switch being turned on by the timing and control means.

45. A high speed comparator comprising:
a first p-channel transistor having its source connected to a supply voltage terminal and having its gate connected to an input terminal;

a first n-channel transistor having its drain connected at a first a terminal to the drain of the first p-channel transistor and having its source connected to a common connection;

a second p-channel transistor having its source connected to the supply terminal and having its gate connected to a bias terminal;

a second n-channel transistor having its drain connected at a second terminal to the drain of the second p-channel transistor and having its source connected to the common connection;

a third n-channel transistor having its drain connected to the common connection and its source connected to ground;

means for connecting the gate of the third n-channel transistor to receive a clock pulse;

first means connecting the gate of the second n-channel transistor to the first terminal, and for connecting the gate of the first n-channel transistor to the second terminal;

a third p-channel transistor having its source connected to the supply terminal and its drain to the first terminal;

a fourth p-channel transistor having its source connected to the supply terminal and having its drain connected to the second terminal;

second means connecting the gates of the third and fourth p-channel transistors together and to receive a clock pulse;

third means for coupling the first terminal to an output terminal;

bias means for automatically applying a bias voltage to the bias terminal to set the switching level and sensitivity of the first and second p-channel and the first and second n-channel transistors to a desired level, the bias means comprising circuit means connected to the output terminal, a switch/filter unit coupled between the circuit means and the bias terminal, and comprising means for applying to the switch/filter unit in timed sequence first and second phase pulses; and timing and control means for providing clock pulses each having a period and being an asymmetrical square wave having a high portion substantially longer than a low portion, the timing means generating a series of phase pulses each having a duration equal to that of the high portion of a clock pulse, the low portion of a clock pulse turning off the third n-channel transistor and turning on the third and fourth p-channel transistors.

46. The comparator of claim 44 further comprising input circuit means connected to a reference voltage and having a first switch connected to the input terminal of the first p-channel transistor, the first switch being actuated by the timing and control means such that the first and second p-channel transistor and the first and second n-channel transistors rapidly drive the first and second terminals high and low or low and high, respectively, depending on whether the bias voltage is slightly higher or lower than the reference voltage, the bias voltage remaining at a set value during a plurality of clock pulses, and being incrementally settable up or down by the switch/filter unit.

47. The comparator of claim 44 further comprising balancing means connected to the second terminal to balance the capacity of the third means, the comparator being symmetrically connected with complementary transistors for high immunity to common mode noise.

48. The comparator of claim 45 further comprising:
second input circuit means connected to a voltage source for supplying a voltage which incrementally decreases with time, the second input means having a first small capacitor connected to the input terminal of the first p-channel transistor and a second switch connected to the other side of the capacitor and the decreasing voltage source; and
compensation means for applying an offset voltage to one of the p-channel and n-channel transistors until the voltage from the voltage source falls below a pre-determined value.

49. The comparator of claim 47 wherein the compensation means includes a second capacitor connected to the input of the first p-channel transistor, and feedback means connected between the output terminal of the third means and the other side of the second capacitor.

50. A high speed comparator comprising:
a regenerative latch having an input, an output, and a bias terminal and having a switching point determined by the difference between the voltage on the bias terminal and the voltage at the input terminal;
input circuit means for connecting the input terminal to a reference voltage and having a first capacitor one side of which is connected to the input terminal, having a second switch connected between the other side of the capacitor and to an input signal voltage to be sampled, and having a third switch connected to the other side of the capacitor and to a second voltage which incrementally decreases step by step in value;
auto-bias means feedback connected between the latch output and the bias terminal, the feedback means generating a bias voltage corresponding to a switching point determined by the reference voltage; and
timing means generating clock pulses for driving the latch and the first, second and third switches in a desired sequence such that the bias voltage is set to a determined value, and the latch responds in succession to the declining second voltage.

51. The comparator of claim 49 in further combination with offset means for automatically compensating for settling time at the latch input, the offset means comprises offset generating means for generating an offset voltage, and feedback means for applying the offset voltage to the latch, and for removing the offset voltage when the incrementally decreasing second voltage falls below a pre-determined value, such that the latch is able accurately to determine the input voltage at a much higher sampling speed than without the offset compensation.

* * * * *